(12) United States Patent
Ikeda et al.

(10) Patent No.: US 7,089,637 B2
(45) Date of Patent: *Aug. 15, 2006

(54) METHOD OF PRODUCING A PIEZOELECTRIC/ELECTROSTRICTIVE DEVICE

(75) Inventors: Koji Ikeda, Hisai (JP); Fumitake Takahashi, Nagoya (JP); Kazuyoshi Shibata, Mizunami (JP)

(73) Assignee: NGK Insulators, Ltd., Nagoya (JP)

(*) Notice: Subject to any disclaimer, the term of this patent is extended or adjusted under 35 U.S.C. 154(b) by 166 days.

This patent is subject to a terminal disclaimer.

(21) Appl. No.: 10/832,077

(22) Filed: Apr. 26, 2004

(65) Prior Publication Data

US 2004/0237271 A1    Dec. 2, 2004

Related U.S. Application Data

(62) Division of application No. 10/237,495, filed on Sep. 9, 2002, now Pat. No. 6,766,568, which is a division of application No. 09/878,773, filed on Jun. 11, 2001, now Pat. No. 6,531,805.

(30) Foreign Application Priority Data

Jun. 16, 2000  (JP)  ............................ 2000-182354
Mar. 30, 2001  (JP)  ............................ 2001-99039

(51) Int. Cl.
  *H04R 17/00*  (2006.01)
  *H01L 41/06*  (2006.01)
(52) U.S. Cl. .................. 29/25.35; 29/25.41; 29/25.45; 29/830; 29/417; 310/328
(58) Field of Classification Search ............. 29/25.35, 29/25.45, 25.41, 830, 417; 310/328, 331, 310/336; 72/379.2
See application file for complete search history.

(56) References Cited

U.S. PATENT DOCUMENTS 3,146,367 A   8/1964   McNancy
3,304,773 A   2/1967   Rogallo (Continued)

FOREIGN PATENT DOCUMENTS

JP    62-168535    10/1987

(Continued)

OTHER PUBLICATIONS

"Piezoelectric Piggy-Back Microactuator for Hard Disk Drive". Yoshikazu Soeno et al. IEEE Transactions on Magnetics. vol. 35. No. 2. Mar. 1999.

(Continued)

*Primary Examiner*—A. Dexter Tugbang
*Assistant Examiner*—Tai Nguyen
(74) *Attorney, Agent, or Firm*—Burr & Brown

(57) ABSTRACT

A method of producing a piezoelectric/electrostrictive device having a base including a pair of movable parts opposing each other, a fixing part that connects the movable parts with each other at one end thereof, and mounting parts that extend for a predetermined length while holding slit-shaped gaps of a predetermined width along inside surfaces of said movable parts by being turned around at the other end of said movable parts, said piezoelectric/electrostrictive device having a piezoelectric/electrostrictive element disposed on at least one outside surface of said movable parts of said base, wherein a base block obtained by laminating and calcining a large number of ceramic green sheets is adopted as a material for forming said base, and the base including said movable parts, said fixing part, and said mounting parts is formed by cutting said base block at a predetermined site along a lamination direction of said ceramic green sheets.

1 Claim, 22 Drawing Sheets

U.S. PATENT DOCUMENTS

| | | | |
|---|---|---|---|
| 3,928,778 A | 12/1975 | Ivanov et al. | |
| 4,612,440 A | 9/1986 | Brunnee et al. | |
| 5,173,605 A | 12/1992 | Hayes et al. | |
| 5,191,506 A | 3/1993 | Logan et al. | |
| 5,412,865 A | 5/1995 | Takaoka et al. | |
| 5,500,777 A * | 3/1996 | Hasegawa et al. | 360/77.16 |
| 5,692,280 A | 12/1997 | Taniguchi et al. | |
| 5,745,319 A | 4/1998 | Takekado et al. | |
| 5,758,398 A | 6/1998 | Rijnbeek et al. | |
| 6,198,606 B1 * | 3/2001 | Boutaghou et al. | 360/294.3 |
| 6,246,552 B1 | 6/2001 | Soeno et al. | |
| 6,262,516 B1 | 7/2001 | Fukuda et al. | |
| 6,333,681 B1 | 12/2001 | Takeuchi et al. | |
| 6,455,981 B1 | 9/2002 | Takeuchi et al. | |
| 6,455,984 B1 | 9/2002 | Takeuchi et al. | |
| 6,525,448 B1 | 2/2003 | Takeuchi et al. | |
| 6,534,898 B1 | 3/2003 | Takeuchi et al. | |
| 6,534,899 B1 | 3/2003 | Takeuchi et al. | |
| 6,657,364 B1 | 12/2003 | Takeuchi et al. | |
| 2002/0101133 A1 | 8/2002 | Takeuchi et al. | |
| 2002/0184744 A1 | 12/2002 | Takeuchi et al. | |

FOREIGN PATENT DOCUMENTS

| | | |
|---|---|---|
| JP | 63-64640 | 3/1988 |
| JP | 1-107997 | 7/1989 |
| JP | 02-159982 | 6/1990 |
| JP | 10-136665 | 5/1998 |
| WO | WO98/19304 | 5/1998 |

OTHER PUBLICATIONS

"Dual-Stage Actuator System for Magnetic Disk Drives Using a Shear Mode Piezoelectric Microactuator". S. Koganezawa et al. IEEE Transactions on Magnetics. vol. 35. No. 2. Mar. 1999.

* cited by examiner

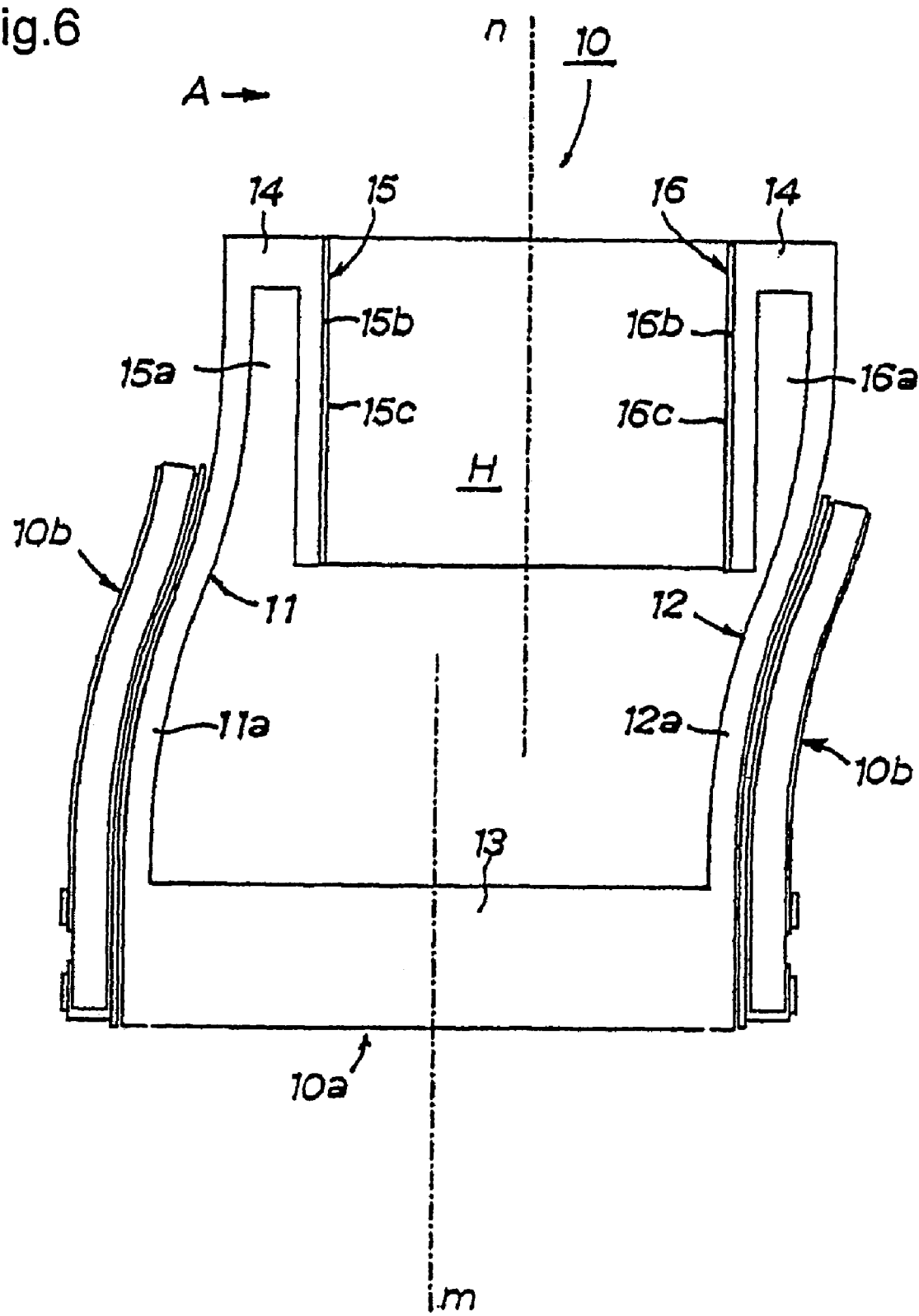

METHOD OF PRODUCING A PIEZOELECTRIC/ELECTROSTRICTIVE DEVICE

CROSS REFERENCE TO RELATED APPLICATIONS

This application is a division of U.S. application Ser. No. 10/237,495 filed Sep. 9, 2002, which in turn is a division of U.S. application Ser. No. 09/878,773 filed Jun. 11, 2001, now U.S. Pat. No. 6,531,805, the entireties of which are incorporated herein by reference.

BACKGROUND OF THE INVENTION

1. Field of the Invention

The present invention relates to a piezoelectric/electrostrictive device of a form such that the displacement operation of a piezoelectric/electrostrictive element is transmitted to a pair of right and left movable parts to control a component to be controlled, which component is sandwiched and held by the other ends of the movable parts, or the displacement operation of a pair of right and left movable parts that sandwich and hold a component to be inspected on the other end is sensed by a piezoelectric/electrostrictive element to sense the characteristics of the component to be inspected.

2. Description of the Background Art

Referring to FIG. 1, a conventional piezoelectric/electrostrictive device having such a form is constructed in such a manner that a piezoelectric/electrostrictive element 10b is disposed on each of the outside surfaces of a pair of right and left movable parts 11, 12 constituting a base 10a. Movable parts 11, 12 are connected with each other by means of a connecting part 13 on one end thereof, and movable part bodies 11a, 12a extend towards the other end thereof. The other end of movable part bodies 11a, 12a are made into mounting parts 11b, 12b for mounting a component H such as a component to be controlled or a component to be inspected.

Mounting parts 11b, 12b protrude inwards by a predetermined width from the other end of movable part bodies 11a, 12a, so as to oppose each other by holding a predetermined interval. Component H is fixed to the inside surfaces (joining surfaces) 11b1, 12b1 of mounting parts 11b, 12b via adhesives h1, h2 on the side surfaces of component H, so as to be sandwiched and held by mounting parts 11b, 12b of movable parts 11, 12.

In a piezoelectric/electrostrictive device having such a form, if component H to be mounted is long in the longitudinal direction of the device, one must increase the length L4 of mounting parts 11b, 12b, as shown in FIG. 2. In this case, the total length L1 of the device is elongated by the amount of increase in the length L4 of mounting parts 11b, 12b. Thus, if the length h of component H to be mounted is equal to the length L4 of mounting parts 11b, 12b, the total length L1 of the device is restricted by the length h of component H.

On the other hand, in the case of mounting a long component H shown in FIG. 2 to mounting parts 11b, 12b, if the length L4 of mounting parts 11b, 12b are, for example, left as it is shown in FIG. 1 without being changed, the total length L1 of the device is unchanged irrespective of the length h of component H. However, in this case, the length L4 of mounting parts 11b, 12b will be shorter than the length h of component H, thereby decreasing the area of the joining surface (bonding area) on component H. Therefore, if an ordinary adhesive made of resin is used as adhesives h1, h2, the adhesive strength on component H decreases. Decreases in the adhesive strength on component H in the worst cases cause component H to be dismounted from mounting parts 11b, 12b.

A component H having a large dimension h in the longitudinal direction will have a mass that is increased by the amount of elongation of the length h if the other dimensions and the density thereof remain unchanged. Therefore, if the bonding area is small, for example, if mounting parts 11b, 12b are each in a state shown in FIG. 1, the impact imposed upon each of the adhesives h1, h2 will be large, whereby component H is more liable to be dismounted from each of mounting parts 11b, 12b.

In a piezoelectric/electrostrictive device having such a form, if component H is dismounted from one of mounting parts 11b, 12b, the other of mounting parts 11b, 12b must support component H to succeed receiving the impact applied to component H. In this state, component H is liable to be dismounted from the other mounting part, and also there is a fear that the supporting balance of the mounted state may be lost to cause the one supporting mounting part or the movable part connected thereto to be broken by the action of torsional force.

In order to meet this problem, one must use an adhesive having an extremely high adhesive strength; however, it is generally difficult to obtain a special adhesive that can ensure a sufficient adhesive strength no matter how small the bonding area is. Furthermore, there is naturally a limit even in the case of using an adhesive having such a special property.

In a piezoelectric/electrostrictive device having such a form, in the case of improving the device properties by increasing the displacement of mounting parts 11b, 12b, one must increase the amount of displacement of the movable part bodies 11a, 12a by increasing the length of the movable part bodies 11a, 12a of movable parts 11, 12. However, in order to increase the length of the movable part bodies 11a, 12a of movable parts 11, 12 without increasing the total length L1 of the device, one must reduce the length of mounting parts 11b, 12b. As a result of this, the bonding area of joining surfaces 11b1, 12b1 at the mounting parts 11b, 12b will be smaller to weaken the adhesive force of component H to joining surfaces 11b1, 12b1 of mounting parts 11b, 12b all the more, whereby component H will be more liable to be dismounted and drop off from joining surfaces 11b1, 12b1.

In a piezoelectric/electrostrictive device having such a form, in order to mount component H onto mounting parts 11b 12b of movable parts 11, 12, component H is bonded to joining surfaces 11b1, 12b1 generally through the intermediary of adhesives h1, h2 made of resin. However, adhesives h1, h2 made of resin will have a reduced hardness or reduced Young's modulus when the temperature changes above room temperature. The temperature change of the state of use of piezoelectric/electrostrictive devices is, for example, of a degree within a range from room temperature to 100° C. However, even in this temperature range, adhesives h1, h2 will be softened at a high temperature. For this reason, the distortion of adhesives h1, h2 when an external force is applied will differ greatly between the state of room temperature and the state of a higher temperature than this. Therefore, the device properties of the piezoelectric/electrostrictive device having this form will differ greatly at a state of high temperature, even though the device properties in a state of room temperature remain as originally set.

FIGS. 3 and 4 illustrate the operation state of the device at a low temperature such as room temperature and at a higher temperature than room temperature, respectively. The influence caused by such a temperature change (temperature variation) will be larger accordingly as the bonding area is smaller, because the distortion imposed upon the adhesive will be larger accordingly as the bonding area is smaller. Therefore, as the bonding area increases, the influence of the temperature variation will be smaller.

In a piezoelectric/electrostrictive device having such a form, if component H increases in size to increase its mass, fixing part 13 for fixing the device itself must support the combined mass of component H and the device itself. Therefore, if an impact is received, fixing part 13 is liable to be dismounted. If the length L2 of fixing part 13 is increased in order to increase the bonding area, the total length L1 of the device will also increase.

SUMMARY OF THE INVENTION

Thus, an object of the present invention is to increase the displacement of each movable part and to sufficiently ensure the bonding between each mounting part and the component as well as the fixation of the device itself without changing the total length of the device and without reducing the bonding area at the joining surfaces of the mounting parts in a piezoelectric/electrostrictive device having such a form. Further, an object of the present invention is to firmly mount the component and the device in the case where the component is especially large and heavy or in the case where a large adhesive strength is needed.

The present invention relates to a piezoelectric/electrostrictive device and a production method thereof, and is directed to a piezoelectric/electrostrictive device having a base including a pair of movable parts opposing each other and a fixing part that connects the movable parts with each other at one end thereof, wherein the piezoelectric/electrostrictive device has a piezoelectric/electrostrictive element disposed on at least one outside surface of the movable parts of the base.

Now, the piezoelectric/electrostrictive device according to the present invention is characterized in that the base includes a pair of long mounting parts disposed at the other end of the movable parts for mounting a component to be controlled or a component to be inspected, and the mounting parts extend for a predetermined length while holding slit-shaped gaps of a predetermined width along inside surfaces of the movable parts by being turned around at the other end of the movable parts.

In the piezoelectric/electrostrictive device according to the present invention, the fixing part constituting the base can be constructed to include a pair of slit-shaped gaps of a predetermined width disposed on the opposing sides of the fixing part and extending along the inside surfaces of the movable parts.

In the piezoelectric/electrostrictive device according to the present invention, the base is constructed with a ceramic laminate formed by laminating and calcining a plurality of ceramic green sheets in a large number, or constructed with a metal laminate formed by laminating and joining a plurality of metal plates in a large number, or constructed by bending one sheet of a flat plate made of metal.

In the piezoelectric/electrostrictive device according to the present invention, the slit-shaped gaps between the movable parts and the mounting parts constituting the base and/or the slit-shaped gaps along the movable parts of the fixing part can be set to have a dimension that does not restrict a displacement of the movable parts during an operation of the piezoelectric/electrostrictive device. Further, each mounting part and each movable part can be formed to have identical or approximately equal thicknesses. A component to be controlled or a component to be inspected is fixed onto inside surfaces of the movable parts constituting the base via an adhesive, and the piezoelectric/electrostrictive device can be used in a state in which the component to be controlled or the component to be inspected is sandwiched and held by the mounting parts.

A more specific construction of the piezoelectric/electrostrictive device according to the present invention is a piezoelectric/electrostrictive device having a base including a pair of plate-shaped movable parts opposing each other, a fixing part that connects the movable parts with each other at one end thereof, and mounting parts connected to the other end of the movable parts, the piezoelectric/electrostrictive device having a piezoelectric/electrostrictive element disposed on at least one outside surface of the movable parts constituting the base, characterized in that slit-shaped gaps intervene between the movable parts and the mounting parts, and a length L12 of the slit-shaped gaps is set to be larger than a length L5 of connecting parts that connect the movable parts to the mounting parts. In the piezoelectric/electrostrictive device, the length L12 of the slit-shaped gaps is at least two times, preferably at least five times, as large as the length L5 of the connecting parts.

Here, the length L5 of the connecting parts and the length L12 of the slit-shaped gaps in the piezoelectric/electrostrictive device refer to the dimensions of the sites as defined in the piezoelectric/electrostrictive device shown in FIG. 21.

A method of producing a piezoelectric/electrostrictive device according to the present invention is a method of producing a piezoelectric/electrostrictive device having a base including a pair of movable parts opposing each other, a fixing part that connects the movable parts with each other at one end thereof, and mounting parts that extend for a predetermined length while holding slit-shaped gaps of a predetermined width along inside surfaces of the movable parts by being turned around at the other end of the movable parts, wherein the piezoelectric/electrostrictive device has a piezoelectric/electrostrictive element disposed on at least one outside surface of the movable parts of the base.

Now, the first method of producing a piezoelectric/electrostrictive device according to the present invention is characterized in that a base block formed by laminating and calcining a large number of ceramic green sheets is adopted as a material for forming the base, and the base including the movable parts, the fixing part, and the mounting parts is formed by cutting the base block at a predetermined site along a lamination direction of the ceramic green sheets.

The second method of producing a piezoelectric/electrostrictive device according to the present invention is characterized in that a flexible and bendable flat plate made of metal is adopted as a material for forming the base, and the base including the movable parts, the fixing part, and the mounting parts is formed by stamping the flat plate into a shape that delineates a planar development of the base so as to obtain a stamped structure, and bending the stamped structure at a predetermined site.

The third method of producing a piezoelectric/electrostrictive device according to the present invention is characterized in that a base block formed by laminating and bonding a plurality of plates made of metal in a large number is adopted, and the base including the movable parts, the fixing part, and the mounting parts is formed by cutting the base block at a predetermined site along a lamination direction of the metal plates.

In the piezoelectric/electrostrictive device according to the present invention, each movable part constituting the base includes a long mounting part, whereby the joining surface of each mounting part is large and the area of bonding the component with each mounting part can be set to be large. For this reason, according to the piezoelectric/electrostrictive device, the adhesive force of the component to the joining surface of each mounting part is strong, so that the component will not be easily dismounted from each mounting part, thereby making it possible to construct a joining structure that is strong against impact. Further, it is possible to prevent a situation in which the separation of the component from one mounting part damages the other mounting part.

Also, in the joining structure, each mounting part extends for a predetermined length while holding a slit-shaped gap of a predetermined width along the inside surface of each movable part by being turned around at the other end of the movable part. For this reason, a joining structure having a strong adhesive force between each mounting part and the component can be constructed without increasing the total length of the device and without degrading the displacement characteristics of the movable parts.

Further, according to this joining structure, even if the component to be bonded to the mounting parts is large and has an increased mass to impose a large external force on the adhesive, a large bonding area can be ensured without increasing the total length of the device, so that the distortion per bonding area can be reduced. For this reason, according to the joining structure, the influence given to the device properties by the temperature change of the adhesive can be greatly restrained as compared with the case in which the bonding area is small, and the operation range in which the set device properties are exhibited in a stable state can be extended to a wide range from low temperature to high temperature.

In the piezoelectric/electrostrictive device according to the present invention, if slit-shaped grooves are provided on both sides of the fixing part constituting the base, the area of the fixing part can be increased, without increasing the total length of the device, by increasing the length of the grooves. By this, the bonding area that fixes the piezoelectric/electrostrictive device can be increased to provide a strong adhesive force, whereby the piezoelectric/electrostrictive device can be firmly fixed. Even if the component to be mounted onto the piezoelectric/electrostrictive device increases in size to have an increased mass and the fixing part must support the combined mass of the device and the component, the adhesive force can be sufficiently enhanced to stabilize the fixation of the device.

As a base constituting the piezoelectric/electrostrictive device according to the present invention, it is possible to adopt a base (first base) constructed with a ceramic laminate formed by laminating and calcining a large number of ceramic green sheets, a base (second base) constructed by bending one sheet of a flat plate made of metal, or a base (third base) constructed with a metal laminate formed by laminating and bonding a plurality of metal plates in a large number. In this case, the slit-shaped gaps between the movable parts and the mounting parts constituting the base are preferably set to have a slit width that does not restrict a displacement of the movable parts during an operation of the piezoelectric/electrostrictive device. Further, each mounting part and each movable part constituting the base are preferably formed to have identical or approximately equal thicknesses. By this, the influence given to the displacement characteristics of the movable parts by the long mounting parts can be restrained to the minimum.

The base can be produced as follows. The first base can be produced with ease by adopting a base block obtained by lamination and calcination of a large number of ceramic green sheets as a material for forming the base, and using means for cutting the base block at a predetermined site along a lamination direction of the ceramic layers to form the base. The second base can be produced with ease by adopting a flexible and bendable flat plate made of metal as a material for forming the base, and stamping the flat plate into a shape that delineates a planar development of the base so as to obtain a stamped structure, and bending the stamped structure at a predetermined site to form the base. The third base can be produced with ease by adopting a flexible and bendable flat plate made of metal and adopting a base block formed by laminating and bonding a large number of the flat plates as a material for forming the base, and using means for cutting the base block at a predetermined site along a lamination direction to form the base.

The piezoelectric/electrostrictive device according to the present invention can be used as active elements such as various transducers, various actuators, frequency region function components (filters), transformers, vibrators for communication or mechanical power, oscillators, and discriminators, as well as sensor elements for various sensors such as supersonic wave sensors, acceleration sensors, angular velocity sensors, impact sensors, and mass sensors. Particularly, the piezoelectric/electrostrictive device can be suitably used as various actuators that are put to use for displacement, positioning adjustment, and angle adjustment mechanism for various precision components of optical instruments and precision apparatus. Here, the piezoelectric/electrostrictive device according to the present invention is a concept used to encompass elements that convert electrical energy to mechanical energy and vice versa.

BRIEF DESCRIPTION OF THE DRAWINGS

FIG. 6 is a plan view illustrating an operation state of the piezoelectric/electrostrictive device;

DETAILED DESCRIPTION OF THE INVENTION

Figure 5:
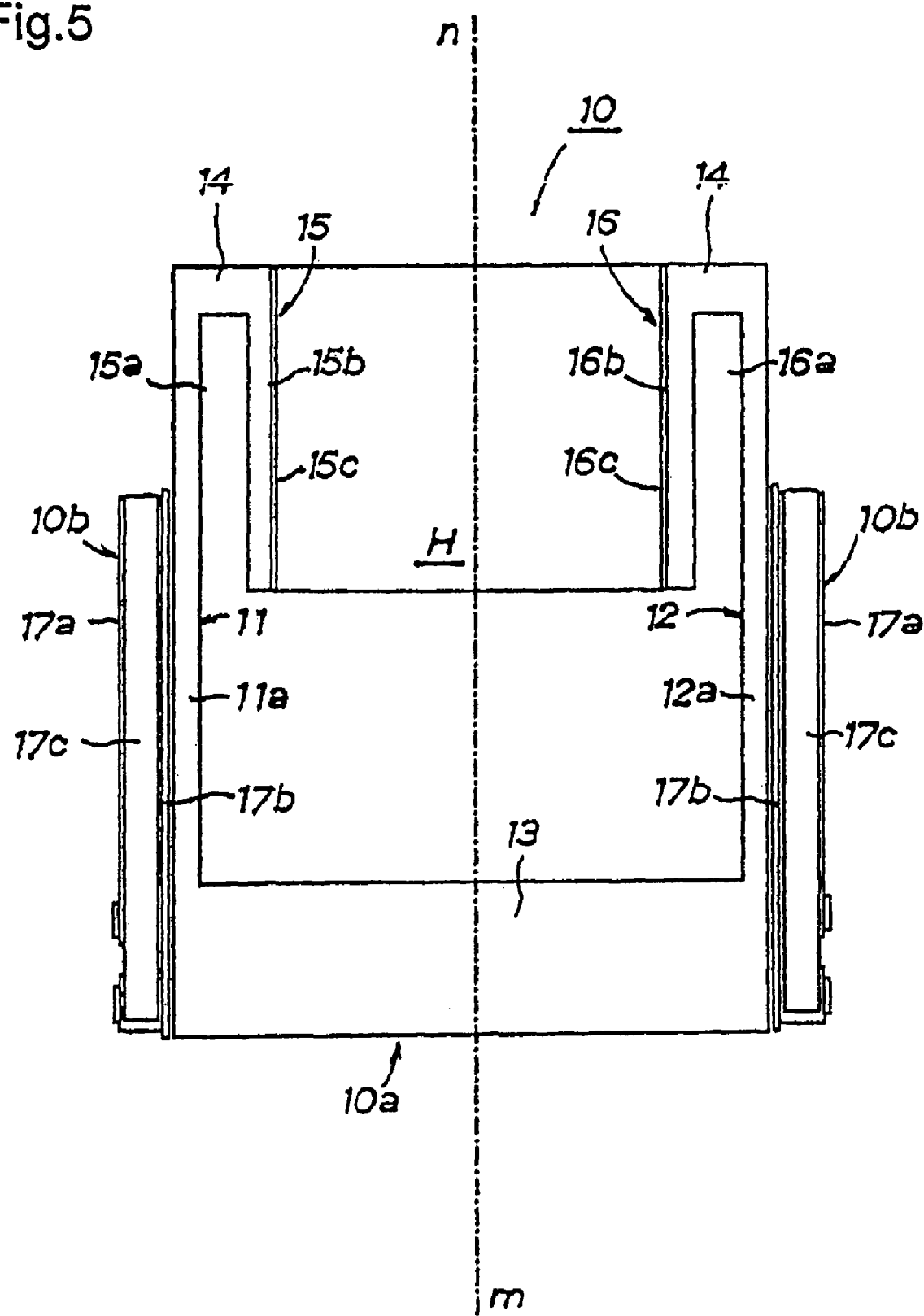
FIG. 5 is a plan view illustrating a piezoelectric/electrostrictive device according to the first embodiment of the present invention.

Hereafter, the present invention will be described with reference to the attached drawings. FIGS. 5 and 6 illustrate a first piezoelectric/electrostrictive device according to the present invention. The piezoelectric/electrostrictive device 10 is made of a base 10a and a pair of piezoelectric/electrostrictive elements 10b. Base 10a is formed by calcination of a laminate of ceramic green sheets.

In the piezoelectric/electrostrictive device 10, base 10a has a shape of an open-topped square whose one side is closed and whose other side is open. Base 10a is constructed with a pair of right and left movable parts 11, 12, a fixing part 13 that connects movable parts 11, 12 with each other at one end thereof, and mounting parts 15, 16 that connect to the other end of movable parts 11, 12 via a connecting part 14. These parts 11 to 16 have an integrated structure composed of a ceramic structure.

In base 10a, each of the movable parts 11, 12 constitutes an operating part by having a piezoelectric/electrostrictive element 10b adhered to an outside surface thereof. Fixing part 13 is fixed at its upper surface side or at its lower surface side, for example, by being bonded to gimbals of a suspension that holds a magnetic head of a hard disk drive. Magnetic head H for hard disk drive for example, which is a component to be controlled, is bonded and fixed to an inside surface of each of the mounting parts 15, 16.

Mounting parts 15, 16 constituting the base 10a each extend for a predetermined length towards one end of movable parts 11, 12 along the inside surfaces of movable parts 11, 12 by being turned around at the other end of movable parts 11, 12 so as to hold slit-shaped gaps 15a, 16a of a predetermined width between mounting parts 15, 16 and inside surfaces of movable parts 11, 12. Mounting parts 15, 16 each extend approximately to a central part of movable parts 11, 12, and the inside surfaces thereof are formed to be joining surfaces 15b, 16b for bonding magnetic head H. The side surfaces of magnetic head H are bonded to the entire surface of joining surfaces 15b, 16b via adhesives 15c, 16c. An adhesive made of epoxy resin or the like is adopted as adhesives 15c, 16c so as to ensure a large bonding area.

Slit-shaped gaps 15a, 16a between mounting parts 15, 16 and movable parts 11, 12 are set to have such a dimension that the displacement of movable parts 11, 12 is not restricted when piezoelectric/electrostrictive device 10 operates. In other words, slit-shaped gaps 15a, 16a are set to have an interval such that movable parts 11, 12 do not abut against mounting parts 15, 16 when movable parts 11, 12 are subjected to displacement operation. This prevents influence on the displacement properties of movable parts 11, 12 caused by mounting parts 15, 16 that are located on the inner surface side of movable parts 11, 12 and on the device characteristics caused by this.

Figure 7A:
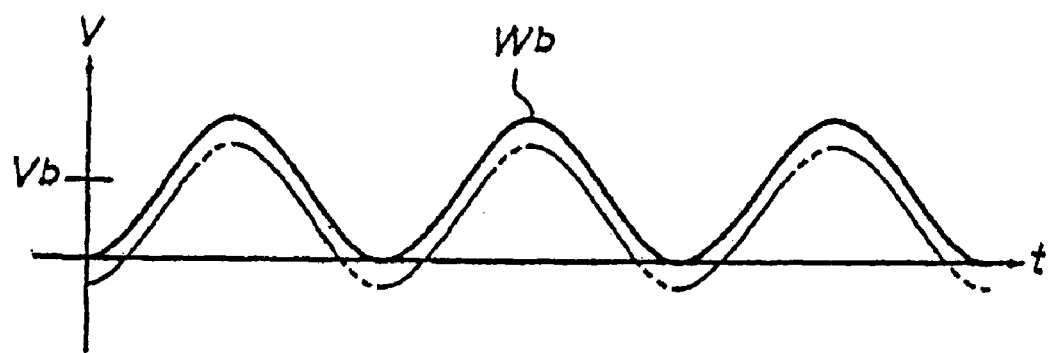
FIGS. 7A and 7B are views illustrating a waveform of a voltage applied to each piezoelectric/electrostrictive element of the piezoelectric/electrostrictive device.
Figure 7B:
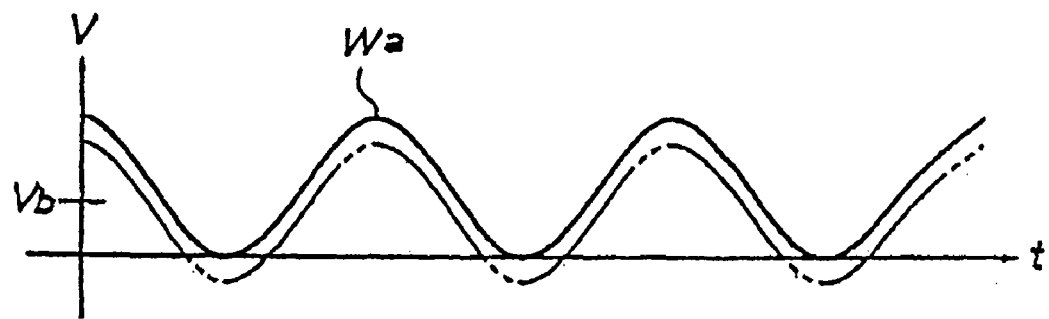

Piezoelectric/electrostrictive device 10 is in a state shown in FIG. 5 at the time of non-operation when a voltage is not applied to piezoelectric/electrostrictive element 10b. In this state, the longitudinal axis m (central axis of fixing part 13) of piezoelectric/electrostrictive device 10 is almost coincident with the central axis n of mounting parts 15, 16. In this state, a sinusoidal wave Wb having a predetermined bias voltage Vb is applied to a pair of electrodes 17a, 17b in one piezoelectric/electrostrictive element 10b, for example, as shown in the waveform diagram of FIG. 7A, and a sinusoidal wave Wa having a phase different by approximately 180° from that of the sinusoidal wave Wb is applied to a pair of electrodes 17a, 17b in the other piezoelectric/electrostrictive element 10b, for example, as shown in FIG. 7B. As a result of this, at the stage when for example the maximum voltage is applied to the pair of electrodes 17a, 17b in the one piezoelectric/electrostrictive element 10b, the piezoelectric/electrostrictive layer 17c in the one piezoelectric/electrostrictive element 10b undergoes shrinking displacement in its principal surface direction.

This generates a stress that deflects one movable part 11 in the illustrated right direction (direction shown by arrow A) in piezoelectric/electrostrictive device 10, for example, as shown in FIG. 6. By this stress, movable part 11 is deflected in that direction. In this case, the pair of electrodes 17a, 17b in the other piezoelectric/electrostrictive element 10b is in a state in which a voltage is not applied. Therefore, the other movable part 12 follows the deflection of the one movable part 11 so as to deflect in the same direction as that of movable part 11. As a result of this, movable parts 11, 12 both displace in the illustrated right direction with respect to the longitudinal axis m of piezoelectric/electrostrictive device 10. The displacement amount of this displacement changes in accordance with the maximum value of the voltage applied to each piezoelectric/electrostrictive element 10b. The larger the maximum value of the voltage is, the larger the displacement amount will be.

Thus, in piezoelectric/electrostrictive device 10, a minute displacement of piezoelectric/electrostrictive element 10b is amplified to become a large displacement operation by utilizing the deflection of movable parts 11, 12, and is transmitted to movable parts 11, 12. This makes it possible to displace mounting parts 15, 16 to a large extent with respect to the longitudinal axis m of piezoelectric/electrostrictive device 10, whereby position control of magnetic head H, for example, can be carried out accurately.

In the meantime, piezoelectric/electrostrictive device 10 produces various conspicuous functions and effects such as described below, as compared with conventional piezoelectric/electrostrictive devices having this type of form. Namely, in piezoelectric/electrostrictive device 10, the area of bonding component H (for example, a magnetic head) can be set to a large value to greatly increase the bonding force without increasing the total length of the device, whereby the dislocation of component H from mounting parts 15, 16 and damages to mounting parts 15, 16 can be prevented. Further, the thickness of adhesives 15c, 16c that are allowed to intervene between component H and joining surfaces 15b, 16b of mounting parts 15, 16 can be decreased to greatly reduce the influence given to the device characteristics caused by the temperature change of adhesives 15c, 16c. Furthermore, the arm length (movable part bodies 11a, 12a) of movable parts 11, 12 can be set to a large value, whereby the maximum displacement amount of movable parts 11, 12 can be increased to improve the device characteristics.

Figure 1:
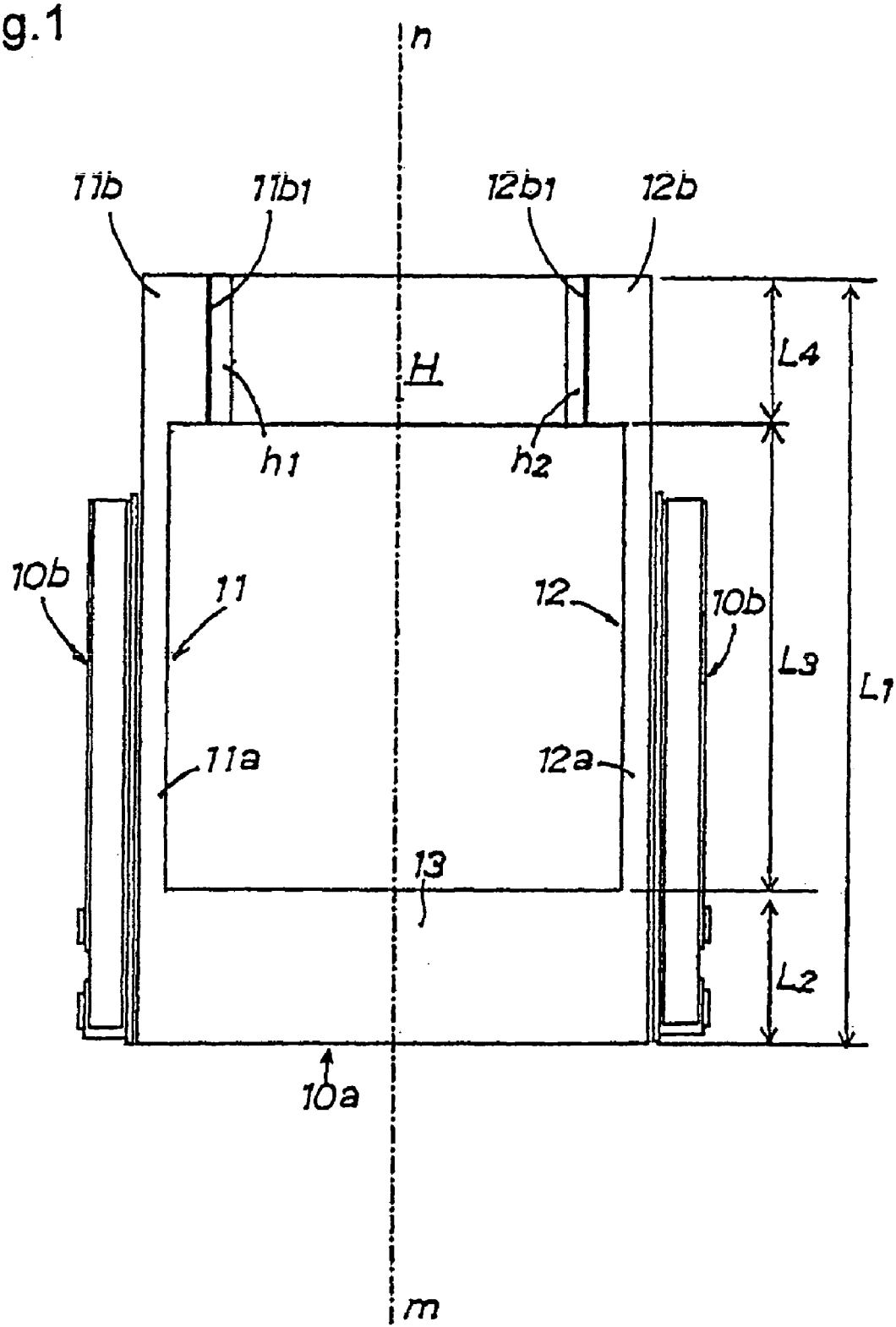
FIG. 1 is a plan view illustrating one example of a conventional piezoelectric/electrostrictive device.
Figure 2:
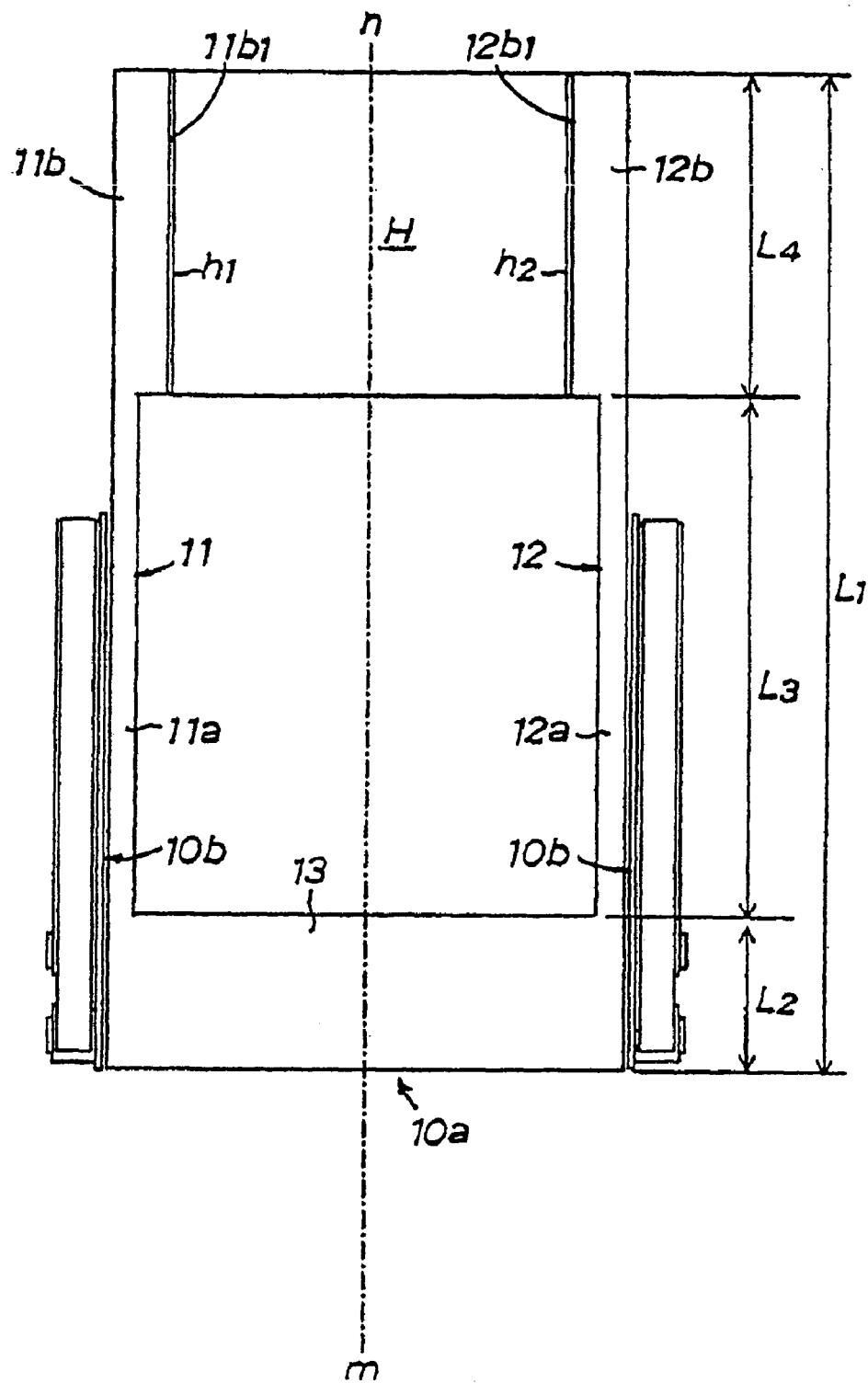
FIG. 2 is a plan view illustrating another example of a conventional piezoelectric/electrostrictive device.
Figure 3:
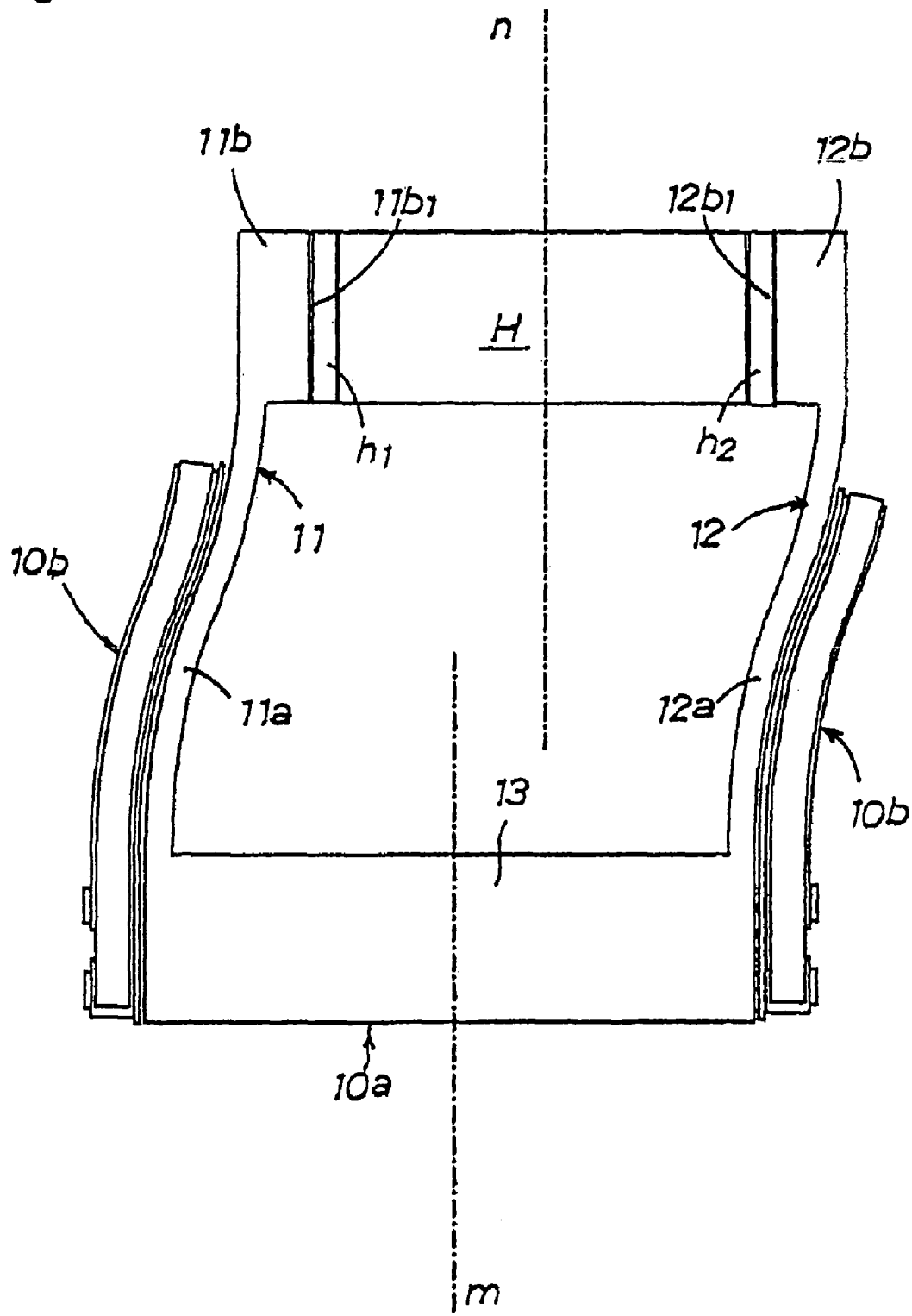
FIG. 3 is a plan view illustrating an operation state of a piezoelectric/electrostrictive device according to one example of the prior art.
Figure 4:
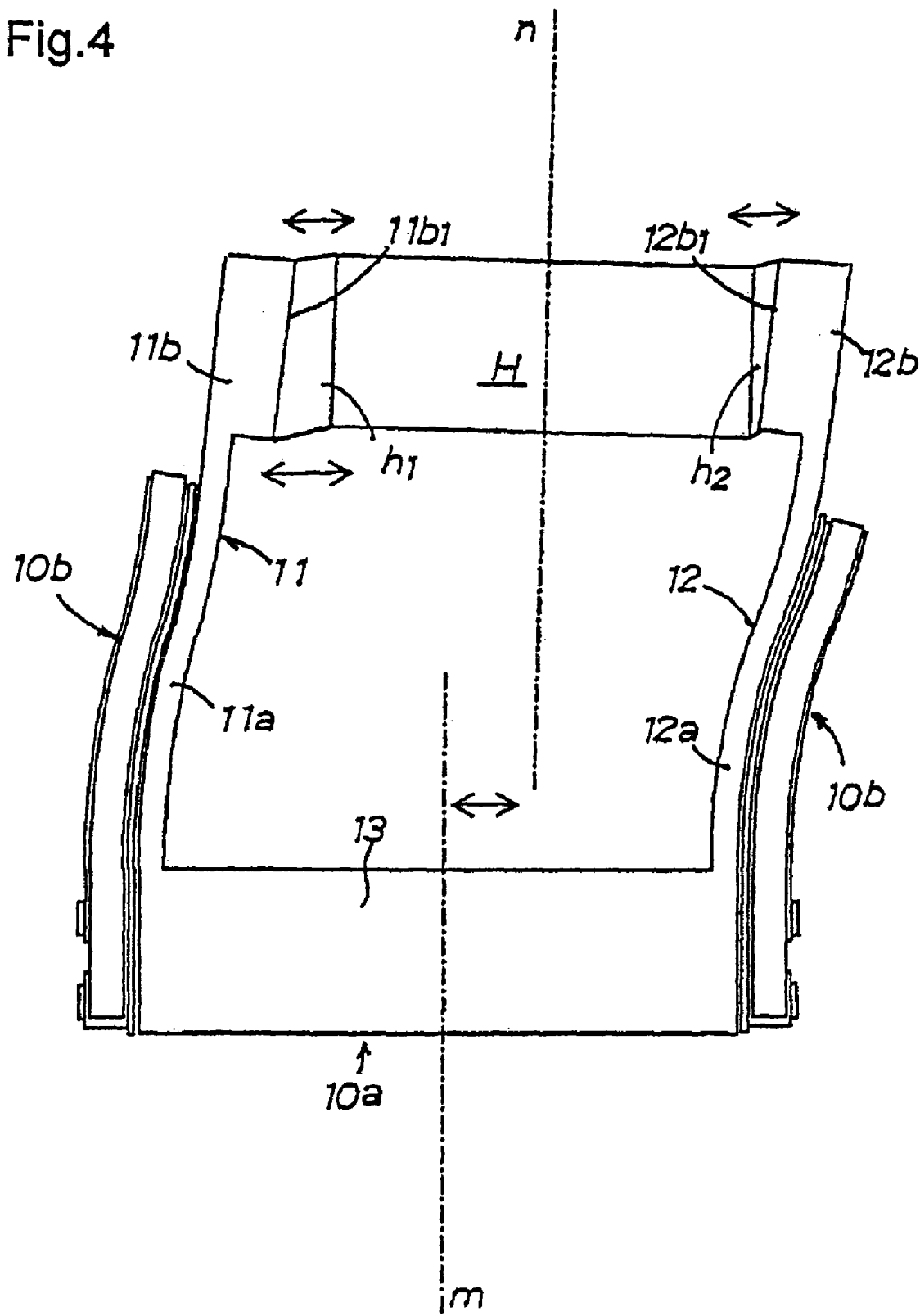
FIG. 4 is a plan view illustrating a state in which an inconvenience has occurred at the time of operation of the piezoelectric/electrostrictive device.
Figure 8:
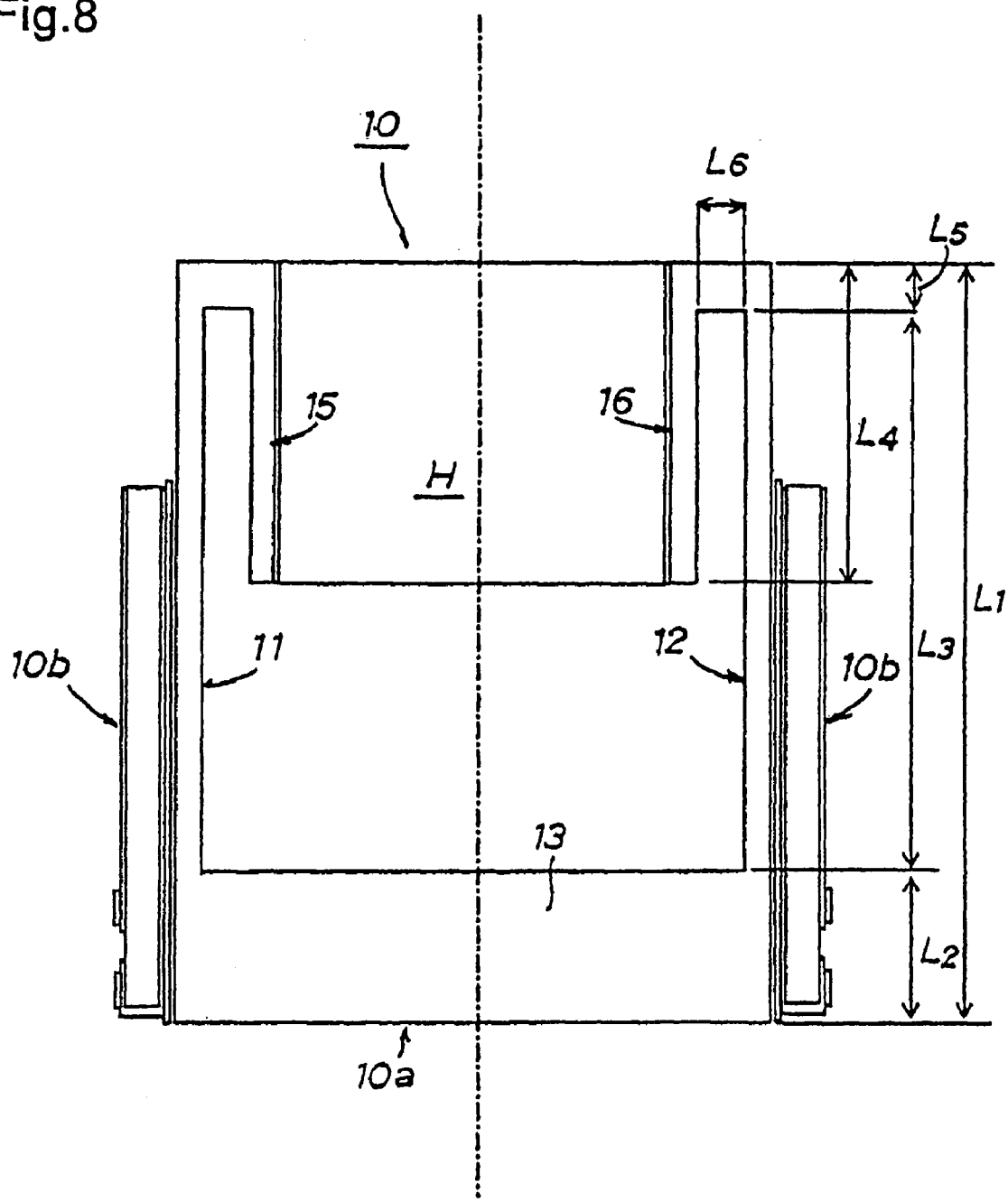
FIG. 8 is a plan view illustrating a dimensional relationship of the piezoelectric/electrostrictive device with respect to the conventional piezoelectric/electrostrictive device (shown in FIG. 1)

In FIG. 1 that shows a conventional piezoelectric/electrostrictive device having this type of form and in FIG. 8 that shows a piezoelectric/electrostrictive device 10 according to one example of the present invention, the same symbols represent the dimensional relationship of each site in the piezoelectric/electrostrictive device and the base. In these figures, symbol L1 is the length of the device (which is also the total length of the base), symbol L2 is the length of the fixing part in the base, symbol L3 is the length of the arm of the movable part in the base, and symbol L4 is the length of the joining surface of the mounting part in the base. Symbol L5 is the length of the connecting part which is a characteristic site of the piezoelectric/electrostrictive device according to the present invention, and symbol L6 is the interval of the slit-shaped gaps between the movable parts and the mounting parts, which gaps are characteristic sites of the piezoelectric/electrostrictive device according to the present invention.

As will be clearly understood by making a reference to these FIGS. 1 and 8, piezoelectric/electrostrictive device 10 according to the present invention can be confirmed to have excellent functions and effects such as described below, as compared with conventional piezoelectric/electrostrictive devices. Namely, the first one of the functions and effects produced by piezoelectric/electrostrictive device 10 is that the length L4 of the joining part to component H is extremely large, so that the bonding area to component H can be set to be large without increasing the total length L1 of the base. By this, the adhesive force to component H is made considerably strong to prevent dislocation of component H from mounting parts 15, 16 and the damages to mounting parts 15, 16.

The second one of the functions and effects produced by piezoelectric/electrostrictive device 10 is that, due to the length L4 of the joining part, the bonding area to component H can be set to a large value to increase the force of bonding component H, whereby the thickness of adhesives 15c, 16c that are allowed to intervene between component H and joining surfaces 15b, 16b of mounting parts 15, 16 can be decreased to greatly reduce the influence given to the device characteristics caused by the temperature change of adhesives 15c, 16c.

The third one of the functions and effects produced by piezoelectric/electrostrictive device 10 is that the arm length L3 of movable parts 11, 12 and the length L4 of joining surfaces 15b, 16b of mounting parts 15, 16 can be set independently from each other. By this, in consideration of the characteristics of the base 10a as a material, the arm length L3 of movable parts 11, 12, and the length L4 of joining surfaces 15b, 16b of mounting parts 15, 16 can be set to arbitrary large values to improve the device characteristics, and to strengthen the bonding force to component H to a greater extent.

Figure 9:
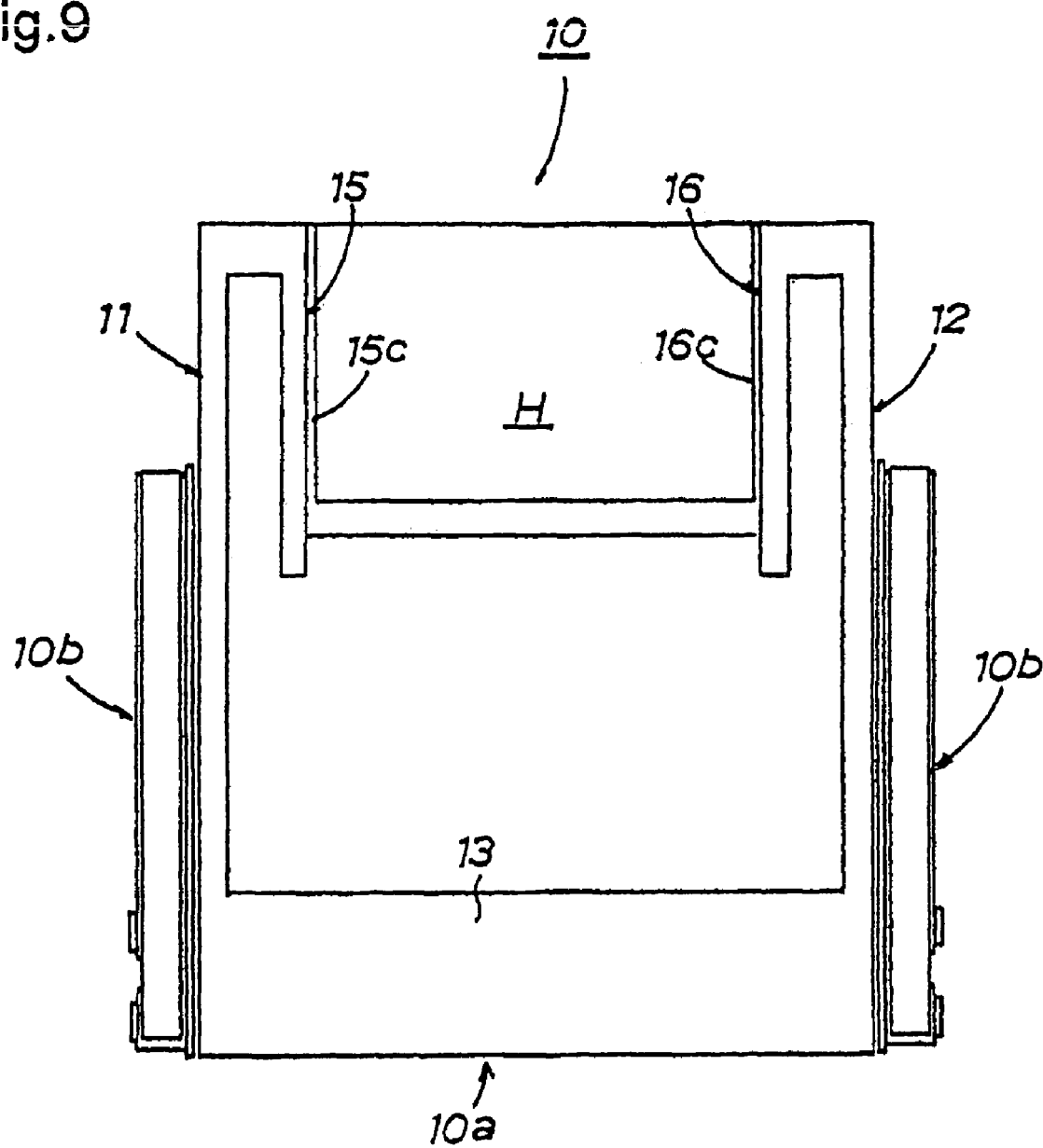
FIG. 9 is a plan view illustrating a state in which another component of the piezoelectric/electrostrictive device is sandwiched and held.
Figure 10:
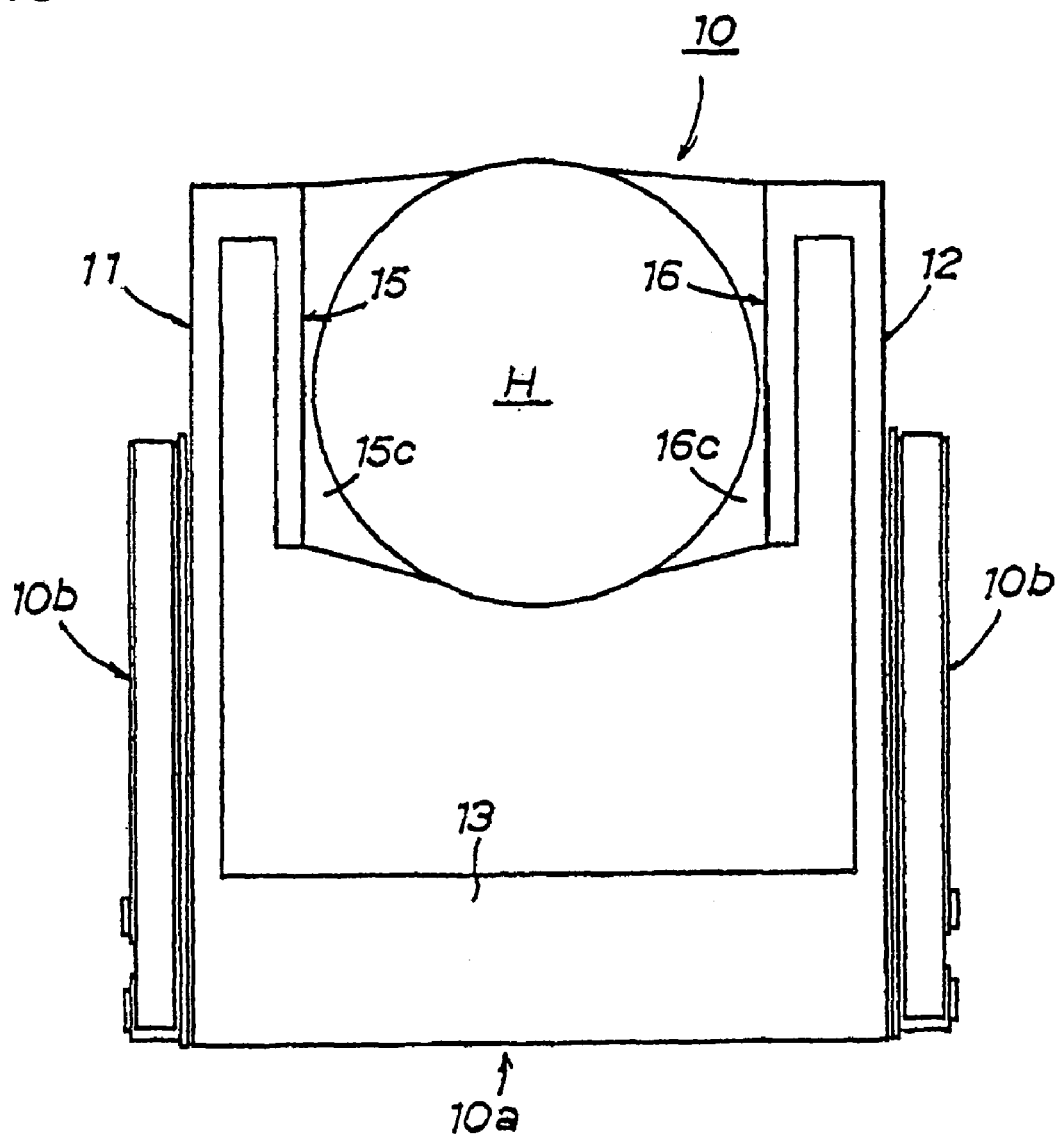
FIG. 10 is a plan view illustrating a state in which still another component of the piezoelectric/electrostrictive device is sandwiched and held.

In piezoelectric/electrostrictive device 10, if the component H to be used is short as shown in FIG. 9, adhesives 15c, 16c can be allowed to go around to one end surface side of component H to ensure a sufficient adhesive strength, and if component H has a cylindrical shape such as a cross section of an optical fiber as shown in FIG. 10, the gap between the outer perimeter of component H and mounting parts 15, 16 can be filled with adhesives 15c, 16c to ensure a sufficient adhesive strength.

Figure 11:
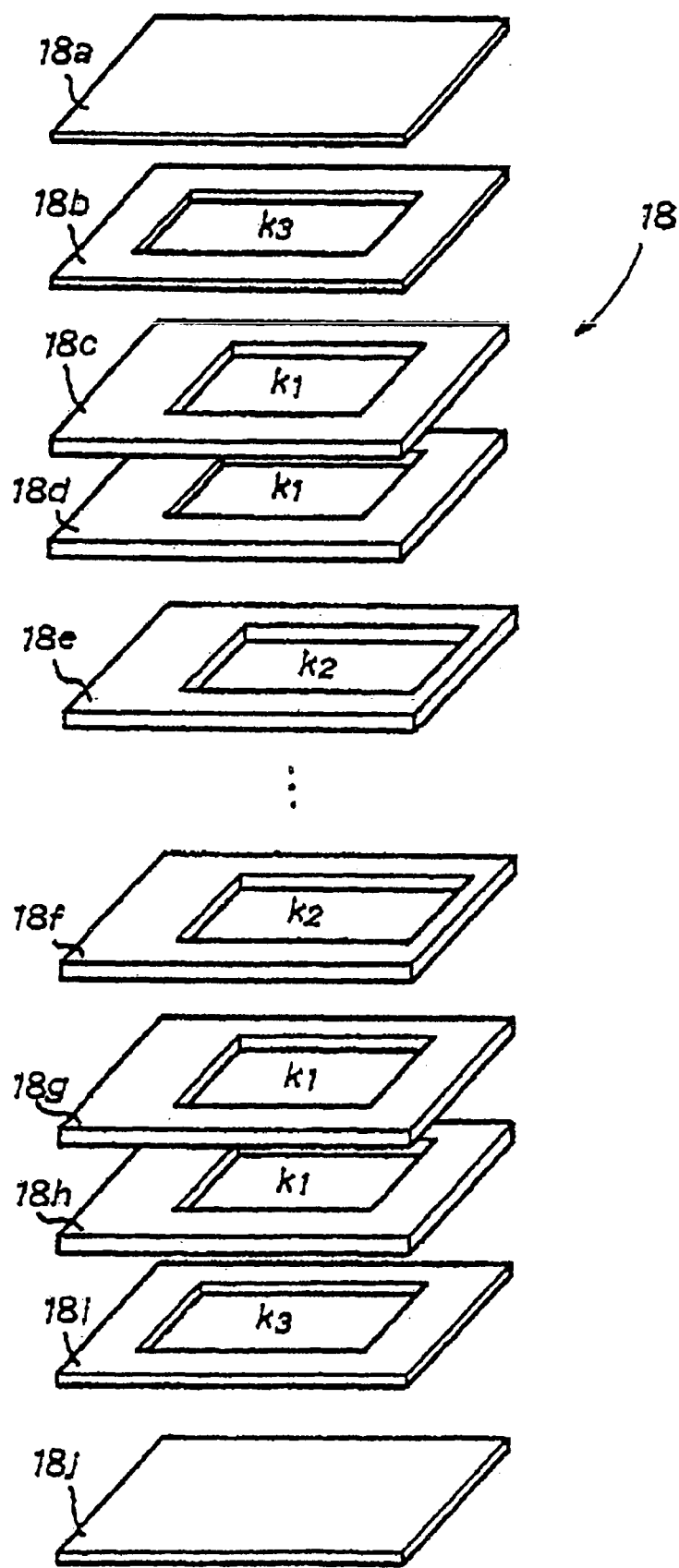
FIG. 11 is a perspective view illustrating each ceramic green sheet constituting a base of the piezoelectric/electrostrictive device.

Next, a specific method of producing piezoelectric/electrostrictive device 10 will be described with reference to FIGS. 11 to 14. The production method is the first one of the production methods according to the present invention, and in this production method, each constituent member is defined as follows. The laminate shown in FIG. 12, which is obtained by laminating ceramic green sheets 18 shown in FIG. 11, is referred to as ceramic green laminate 10A1. The laminate shown in FIG. 13, which is obtained by calcining and integrating the ceramic green laminate 10A1, is referred to as ceramic laminate 10A2. The base shown in FIG. 14, in which mounting parts 15, 16, movable parts 11, 12 and fixing part 13 are integrated by cutting unnecessary portions from the ceramic laminate 10A2, is referred to as ceramic base 10a.

Here, actually in this production method, the ceramic laminate 10A2 is eventually cut into chips in a form such that a plurality of piezoelectric/electrostrictive devices 10 are arranged in longitudinal and lateral directions in the same substrate, so as to produce piezoelectric/electrostrictive devices 10 in a large number in the same step; however, for simplicity of description, a method of producing one piezoelectric/electrostrictive device 10 will be described.

In order to adopt the first production method according to the present invention, ceramic powder such as zirconia is mixed with a binder, a solvent, a dispersant, a plasticizer, and the like by addition to prepare a slurry and, after the slurry is subjected to a defoaming treatment, a ceramic green sheet having a predetermined thickness is prepared by a method such as the reverse roll coater method or the doctor blade method.

Next, the ceramic green sheet is processed into various shapes and thicknesses by a method such as a stamping process using a mold or a laser process, so as to produce plural sheets of ceramic green sheets 18 shown in FIG. 11 for forming a base. These ceramic green sheets 18a to 18j are prepared to include at least plural sheets (for example, four sheets) of ceramic green sheets 18c, 18d, 18g, 18h having a window part k1 formed for forming a space between movable parts 11, 12, plural sheets (for example, seven sheets) of ceramic green sheets 18e to 18f having a window part k2 formed for forming mounting parts 15, 16 having joining surfaces 15b, 16b that are opposed to window part k1 for forming the space between movable parts 11, 12, plural sheets (for example, two sheets) of ceramic green sheets 18b, 18i in which a window part k3 that is to become slit-shaped gaps 15a, 16a is formed, and plural sheets (for example, two sheets) of ceramic green sheets 18a, 18j that are to become movable parts 11, 12 later.

Figure 12:
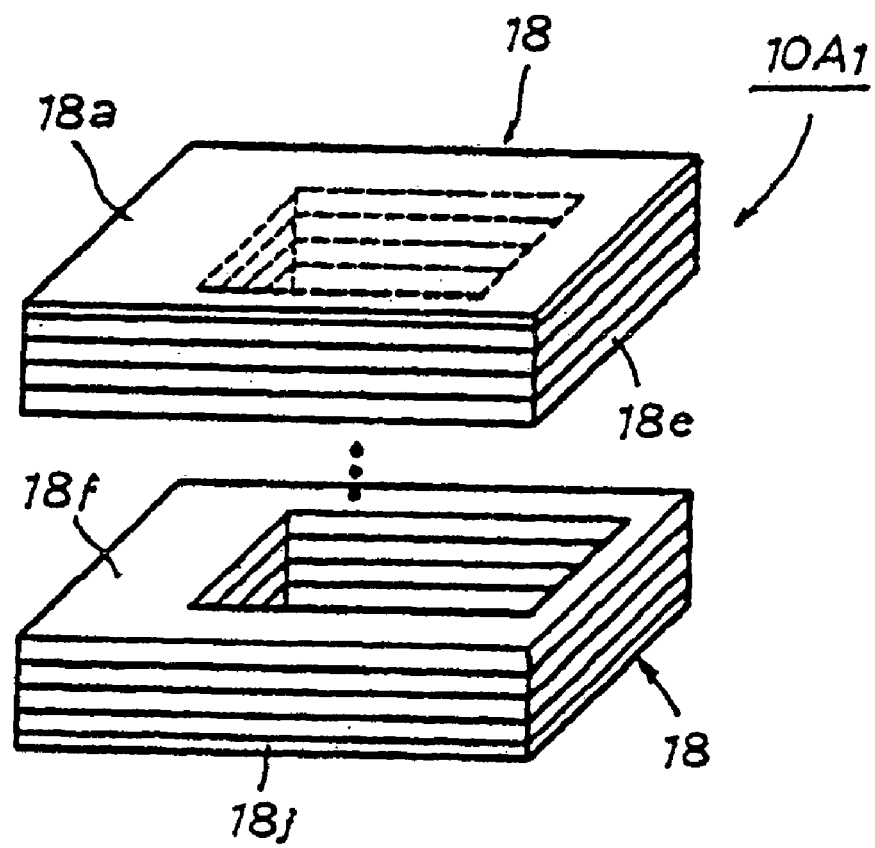
FIG. 12 is a partially omitted perspective view illustrating a ceramic green sheet laminate formed by laminating the ceramic green sheets.

Thereafter, these ceramic green sheets 18 are laminated and press-bonded so that ceramic green sheets 18c to 18h, ceramic green sheets 18b, 18i, and ceramic green sheets 18e to 18f are sandwiched by ceramic green sheets 18a, 18j, so as to form ceramic green laminate 10A1, as shown in FIG. 12. In this lamination, the ceramic green sheets 18 are laminated by positioning ceramic green sheets 18e to 18f at the center. In this case, by the presence of window part k2, a site appears to which a pressure is not applied at the time of press-bonding. Therefore, it is necessary to prevent generation of such a site by changing the order of lamination and press-bonding. Thereafter, the ceramic green laminate 10A1 is calcined to form ceramic laminate 10A2 shown in FIG. 13.

Here, the number of lamination times and the order of lamination for forming ceramic green laminate 10A1 are suitably changed in accordance with the set structure, so that a ceramic green laminate 10A1 having a set structure can be produced, for example, by suitably changing the shapes of window parts k1 to k3, the number of ceramic green sheets 18, or the like in accordance with the set structure. Further, the shapes of window parts k1 to k3 can be determined in accordance with the desired functions, and the number of ceramic green sheets 18 and the thickness of each ceramic green sheet 18 are not specifically limited.

The press-bonding of laminated ceramic green sheets 18 can provide an improved lamination property by addition of heat. Further, in laminating ceramic green sheets 18, a paste, a slurry, or the like containing ceramic powder and a binder as major components can be applied and printed on ceramic green sheets 18 to form a joining aid layer, whereby the lamination property at the interface of ceramic green sheets 18 can be improved. In this case, as the ceramic powder, it is preferable to use a ceramic powder having the same or similar composition as the ceramic used in ceramic green sheets 18. This can ensure the reliability of lamination of ceramic green sheets 18.

Here, if the thickness of ceramic green sheets 18a, 18j is small, it is preferable to handle them using a plastic film, particularly a polyethylene terephthalate film whose surface is coated with a silicone-series lubricant.

Figure 13:
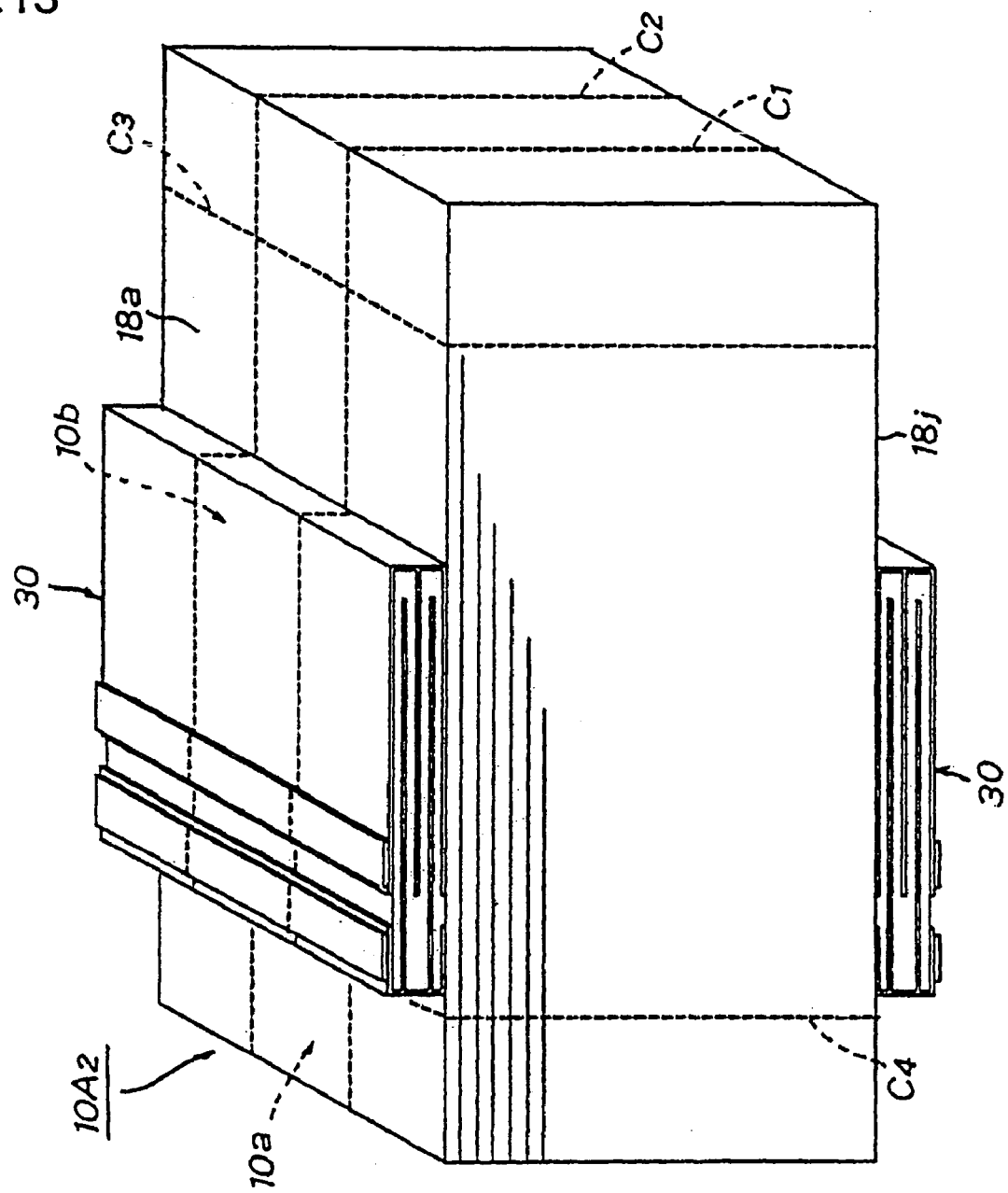
FIG. 13 is a perspective view illustrating a structure in which a ceramic laminate formed by calcining the ceramic green sheet laminate is integrated with a piezoelectric/electrostrictive element body.

A piezoelectric/electrostrictive element body (later-mentioned piezoelectric/electrostrictive element body 30) for forming piezoelectric/electrostrictive element 10b is formed on both surfaces of the obtained ceramic laminate 10A2, that is, on the surfaces formed by laminated ceramic green sheets 18a, 18j, as shown in FIG. 13. As a method for forming piezoelectric/electrostrictive element body 30, one can use a thick film forming method such as the screen printing method, the dipping method, the coating method, or the electrophoresis method, or a thin film forming method such as the ion beam method, the sputtering method, the vacuum vapor deposition method, the ion plating method, the chemical vapor deposition method (CVD), or the plating method. By forming piezoelectric/electrostrictive element body 30 using such a film forming method, piezoelectric/electrostrictive element 10b can be integrally joined with movable parts 11, 12 and disposed without using an adhesive, thereby ensuring the reliability and reproducibility and facilitating the integration.

In forming piezoelectric/electrostrictive element body 30, it is particularly preferable to use a thick film forming method. This is because if a thick film forming method is used for forming piezoelectric/electrostrictive layers 31 to 34, one can form a film by using a paste, a slurry, a suspension, an emulsion, or a sol containing piezoelectric ceramic particles or powder having an average particle size of from 0.01 to 5 μm, preferably from 0.05 to 3 μm, as a major component and, by calcining the formed film, one can obtain good piezoelectric/electrostrictive properties.

Here, the electrophoresis method for forming piezoelectric/electrostrictive element body 30 has an advantage of being capable of forming a film at a high density and with a high shape precision. The screen printing method is advantageous for simplification of the production process because one can carry out film forming and pattern forming at the same time.

To describe forming of piezoelectric/electrostrictive element body 30 more specifically, ceramic green laminate 10A1 is first calcined at a temperature of from 1200° C. to 1600° C., and integrated to form ceramic laminate 10A2. Subsequently, electrode 36 of movable parts 11, 12 are printed and calcined at a predetermined position on both surfaces of ceramic laminate 10A2, and then piezoelectric/electrostrictive layer 34 is printed and calcined, and further the other electrode 35 is printed and calcined. This process is repeated for a predetermined number of times, and during this, a plurality of piezoelectric/electrostrictive layers 33 to 31 are formed in the same manner as piezoelectric/electrostrictive layer 34. Thereafter, terminals 37, 38 for electrically connecting electrodes 35, 36 to a driving circuit are printed and calcined. Here, in forming piezoelectric/electrostrictive element body 30, one may print and calcine electrode 36 of the lowermost layer, print and calcine piezoelectric/electrostrictive layer 34 and electrode 35, and repeat the printing and calcining process by this unit for an arbitrary number of times to form piezoelectric/electrostrictive element body 30.

In forming piezoelectric/electrostrictive element body 30, if materials are selected so that the temperature of calcining each member lowers in accordance with the order of lamination, for example, by using platinum (Pt) as one electrode 36, lead zirconate titanate (PZT) as piezoelectric/electrostrictive layers 31 to 34, gold (Au) as the other electrode 35, and silver (Ag) as terminals 37, 38, then, at each calcination stage, the resintering of the materials previously calcined does not occur, thereby avoiding generation of inconveniences such as exfoliation or agglomeration of electrode materials and others. Here, by selecting suitable materials, each member of piezoelectric/electrostrictive element body 30 and terminals 37, 38 can be successively printed and integrally calcined at a time. Also, after piezoelectric/electrostrictive layer 31 of the outermost layer is formed, electrode 35 or the like of the outermost layer can be disposed at a low temperature. Each member of piezoelectric/electrostrictive element body 30 and terminals 37, 38 do not necessarily need a heat treatment.

In forming piezoelectric/electrostrictive element body 30, it is suitably carried out to form piezoelectric/electrostrictive element body 30 in advance on both surfaces of ceramic green laminate 10A1, that is, on each surface of ceramic green sheets 18a, 18j, and then ceramic green laminate 10A1 and piezoelectric/electrostrictive element body 30 are calcined at the same time. In carrying out the simultaneous calcination, the calcination may be carried out on all the constituent films of ceramic green laminate 10A1 and piezoelectric/electrostrictive element body 30, or methods may be mentioned such that one electrode 36 and ceramic green laminate 10A1 are calcined at the same time or such that the other constituent films excluding the other electrode 35 and ceramic green laminate 10A1 are calcined at the same time.

As a method for simultaneously calcining piezoelectric element body 30 and ceramic green laminate 10A1, one can mention a method in which precursors of piezoelectric/electrostrictive layers 31 to 34 are molded by the tape molding method or the like using a slurry source material, then the precursors of piezoelectric/electrostrictive layers 31 to 34 before calcination are laminated on the surface of ceramic green laminate 10A1 by thermal press-bonding or the like, and calcined at the same time to prepare mounting parts 15, 16, movable parts 11, 12, piezoelectric/electrostrictive layers 31 to 34, and fixing part 13 at the same time. However, in this method, one must form electrode 36 in advance on the surface of ceramic green laminate 10A1 and/or piezoelectric/electrostrictive layers 31 to 34 by using the above-mentioned film forming method.

As another method, one can mention a method of forming and simultaneously calcining electrodes 35, 36 and piezoelectric/electrostrictive layers 31 to 34, which are the constituent layers of piezoelectric/electrostrictive element body 30, by screen printing on the part of ceramic green laminate 10A1 which will eventually become movable parts.

The temperature for calcining the constituent films of piezoelectric/electrostrictive element body 30 is suitably determined by the materials constituting these films. Generally, the temperature is from 500° C. to 1500° C. and, for piezoelectric/electrostrictive layers 31 to 34, the temperature is preferably from 1000° C. to 1400° C. In this case, in order to control the composition of piezoelectric/electrostrictive layers 31 to 34, it is preferable to sinter them in the presence of an evaporation source of the materials of piezoelectric/electrostrictive layers 31 to 34. Here, in the case of simultaneously calcining piezoelectric/electrostrictive layers 31 to 34 and ceramic green laminate 10A1, one must match the calcination conditions of the two. Piezoelectric/electrostrictive element body 30 is not necessarily formed on both surfaces of ceramic laminate 10A2 or ceramic green laminate 10A1, so that it is of course possible to form piezoelectric/electrostrictive element body 30 on only one surface.

Instead of forming piezoelectric/electrostrictive element body 30 directly on ceramic laminate 10A2, one can form piezoelectric/electrostrictive element body 30 as a separate body by the previously mentioned method, and then cut it in an arbitrary manner to form piezoelectric/electrostrictive element 10b. Piezoelectric/electrostrictive element 10b thus formed can be stuck onto a previously formed base 10a with an adhesive such as an organic resin or glass for preparation.

Figure 14:
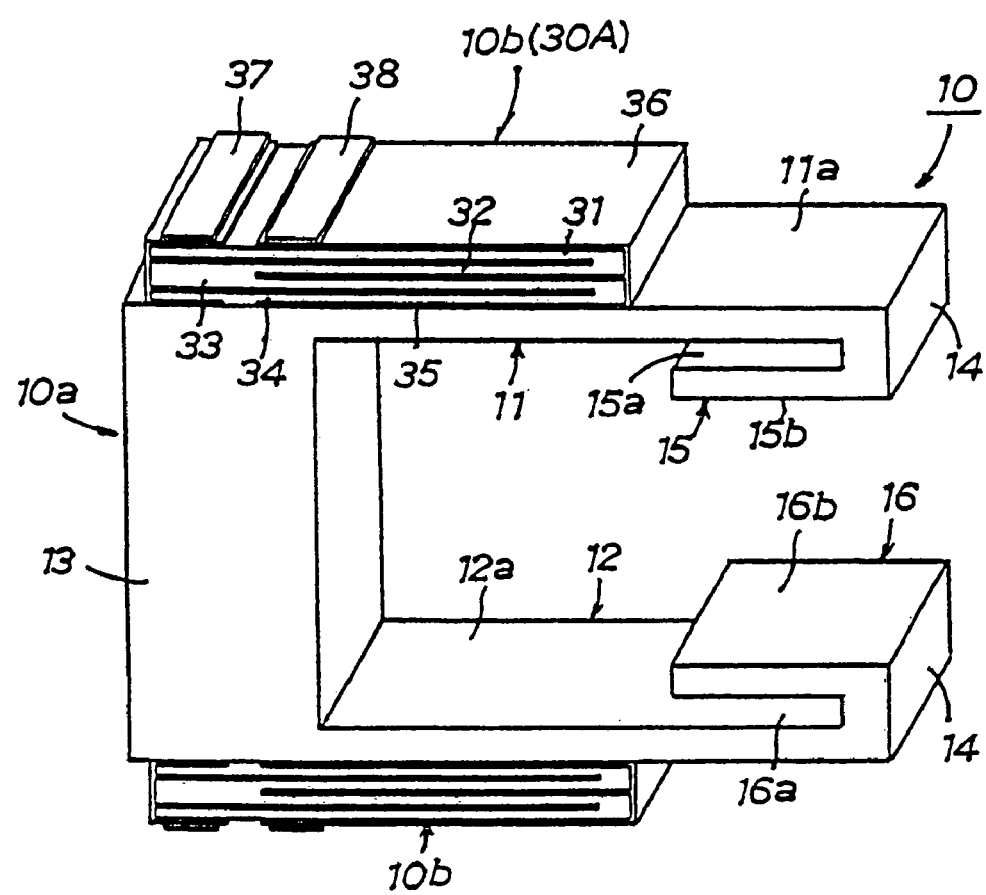
FIG. 14 is a perspective view illustrating the piezoelectric/electrostrictive device formed by cutting the structure.

Ceramic laminate 10A2 having piezoelectric/electrostrictive element body 30 formed thereon is cut at a predetermined site to be formed into piezoelectric electrostrictive device 10 according to the present invention. By cutting ceramic laminate 10A2 integral with piezoelectric/electrostrictive element body 30 along cutting lines C1, C2, C3 shown in FIG. 13, the side parts and the tip end parts of ceramic laminate 10A2 are excised. Referring to FIG. 14, this excision forms piezoelectric/electrostrictive device 10 having mounting parts 15, 16 having joining surfaces 15b, 16b opposing each other in which ceramic base 10a and piezoelectric/electrostrictive element 10b are integrated.

The timing for cutting ceramic laminate 10A2 and piezoelectric/electrostrictive element body 30 may be such that one may cut along cutting line C3 after cutting along cutting lines C1, C2 or one can cut along cutting lines C1, C2 after cutting along cutting line C3. Of course, these cuttings may be carried out at the same time. Further, the end surface of fixing part 13 opposing to cutting line C3 may be suitably cut as cutting line C4 at the time of, for example, precisely controlling the total length of the piezoelectric/electrostrictive device or the like.

In the aforesaid production method, simultaneously with excising unnecessary portions from ceramic laminate 10A2, one can obtain piezoelectric/electrostrictive device 10 having mounting parts 15, 16 having joining surfaces 15b, 16b opposing each other in which ceramic base 10a and piezoelectric/electrostrictive element 10b are integrated, thereby achieving simplification of the production process and improving the yield of piezoelectric/electrostrictive devices 10.

The aforesaid production method is especially preferable in taking out piezoelectric/electrostrictive devices 10 in a large number in the same step by constructing the same substrate (integrated structure of ceramic laminate 10A2 and piezoelectric/electrostrictive element body 30) in such a manner that a plurality of piezoelectric/electrostrictive devices 10 are arranged both in the longitudinal direction and in the lateral direction. As a method of excision, one can apply a mechanical process such as a dicing process or a wire-saw process, a laser beam process using laser such as YAG laser or excimer laser, or an electron beam process. In cutting out ceramic laminate 10A2, these processing methods are combined for processing. For example, it is preferable that cutting lines C1, C2 shown in FIG. 13 are subjected to a wire-saw process, and cutting lines C3, C4 perpendicular to cutting lines C1, C2 (formation of end surfaces of fixing part 13 and mounting parts 15, 16) are subjected to dicing process. Further, in the same manner as the later mentioned method of preparing piezoelectric/electrostrictive device 20, ceramic base 10a and piezoelectric/electrostrictive element 10b individually formed by cutting can be separately prepared, and these can be bonded to prepare piezoelectric/electrostrictive device 10.

The materials of mounting parts 15, 16 and fixing part 13 constituting base 10a are not particularly limited as long as they have rigidity; however, it is preferable to use a ceramic to which the ceramic green sheet lamination method can be applied. Specifically, materials and others containing zirconia starting with stabilized zirconia and partially stabilized zirconia, alumina, magnesia, silicon nitride, aluminum nitride, ortitanium oxide as a major component may be mentioned. Also, materials containing a mixture of these as a major component may be mentioned. However, in view of high mechanical strength and toughness, materials containing zirconia, particularly stabilized zirconia, as a major component, and materials containing partially stabilized zirconia as a major component are preferable.

As described above, movable parts 11, 12 constituting base 10a are parts that are driven by displacement of piezoelectric/electrostrictive element 10b. Movable parts 11, 12 are flexible members shaped like a thin plate, and have a function of amplifying the extending and shrinking displacement of piezoelectric/electrostrictive element 10b disposed on the surface as a bending displacement, and transmits the displacement to mounting parts 15, 16. Therefore, it is sufficient that the shape or the material quality of movable parts 11, 12 are flexible and have mechanical strength of a degree that will not be broken by bending deformation, so that the materials can be suitably selected in consideration of the responsiveness and operability of mounting parts 15, 16.

The thickness L10 of movable parts 11, 12 is preferably about 2 μm to 100 μm, and the combined thickness of movable parts 11, 12 and piezoelectric/electrostrictive element 10b is preferably from 7 μm to 500 μm. The thickness of electrodes 35, 36 is preferably from 0.1 μm to 50 μm, and the thickness of piezoelectric/electrostrictive layers 31 to 34 is preferably from 3 μm to 300 μm.

As the materials constituting movable parts 11, 12, one can suitably use ceramics similar to mounting parts 15, 16 and fixing part 13. In particular, materials containing zirconia, particularly stabilized zirconia, as a major component, and materials containing partially stabilized zirconia as a major component are most suitably used because of having a large mechanical strength, having a high toughness, and having a small reactivity with the piezoelectric/electrostrictive layers or the electrode materials, though being thin.

In stabilized zirconia and partially stabilized zirconia, those that are stabilized or partially stabilized in the following manner are preferable. Namely, as the compounds that stabilize or partially stabilize zirconia, there are yttrium oxide, ytterbium oxide, cerium oxide, calcium oxide, and magnesium oxide. Intended stabilization of zirconia is possible by adding at least one of the compounds and allowing the compound to be contained, or by not only adding only one kind of compound but also adding these compounds in combination.

Here, the amount of addition of each compound is from 1 to 30 mol %, preferably from 1.5 to 10 mol %, in the case of yttrium oxide or ytterbium oxide; from 6 to 50 mol %, preferably 8 to 20 mol %, in the case of cerium oxide; and from 5 to 40 mol %, preferably from 5 to 20 mol % in the case of calcium oxide or magnesium oxide. Among these, it is preferable to use particularly yttrium oxide as a stabilizing material, and in this case, the amount of addition is from 1.5 to 10 mol %, more preferably from 2 to 4 mol %. Also, as an additive such as a sintering aid, one can add alumina, silica, transition metal oxide, and others within a range of from 0.05 to 20 wt %; however, if calcining integration by the film forming method is adopted as a technique for forming piezoelectric/electrostrictive element 10b, it is also preferable to add alumina, magnesia, transition metal oxide, and others as additives. Further, in order to obtain mechanical strength and stable crystal phase, the average crystal grain size of zirconia is preferably from 0.05 to 1 µm. Furthermore, as described above, for movable parts 11, 12, one can use ceramics similar to mounting parts 15, 16 and fixing part 13; however, it is advantageous in obtaining reliability of the joining part, strength of piezoelectric/electrostrictive device 10, and reduction of the cumbersomeness of the structure to construct movable parts 11, 12 preferably with substantially the same material.

Figure 15:
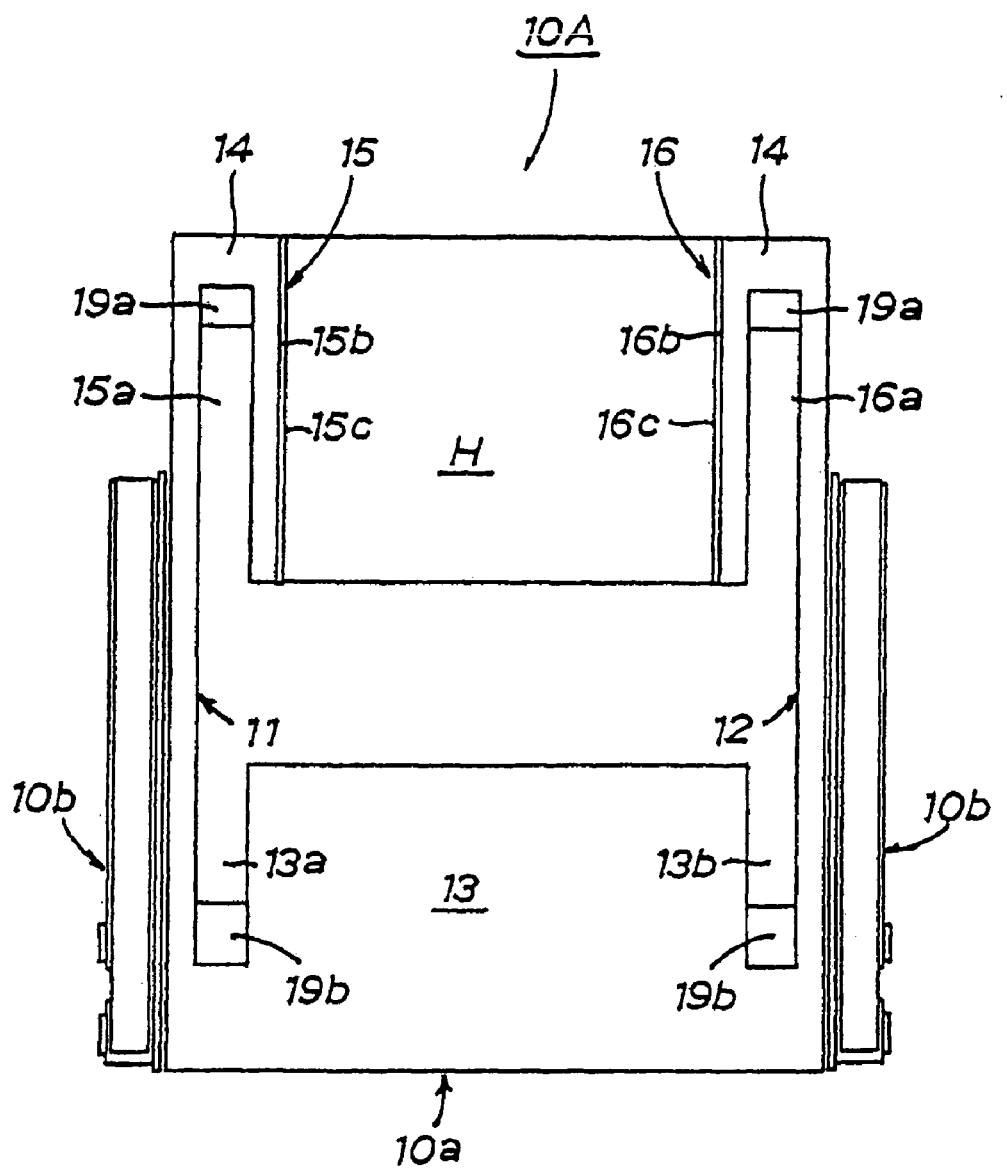
FIG. 15 is a plan view illustrating a modified example of the piezoelectric/electrostrictive device.

FIG. 15 shows a modified example in which the first piezoelectric/electrostrictive device 10 is modified. In the piezoelectric/electrostrictive device 10A according to the modified example, slit-shaped gaps 13a, 13b opposing to gaps 15a, 16a are disposed at the site of the fixing part 13 constituting base 10a on the side of movable parts 11, 12. Rear wall portions of slit-shaped gaps 15a, 16a and slit-shaped gaps 13a, 13b are each filled with elastic members 19a, 19b made of resin.

Piezoelectric/electrostrictive device 10A is intended to cope with the impact from outside of movable parts 11, 12 opposing to mounting parts 15, 16 via slit-shaped gaps 15a, 16a. In piezoelectric/electrostrictive device 10A, if movable parts 11, 12 receive an impact from outside, the stress concentrated on connecting part 14 of movable parts 11, 12 and fixing parts 15, 16 is dispersed and absorbed by elastic members 19a, 19b, thereby improving the impact resistance of movable parts 11, 12 caused by the stress concentration at the connecting part 14.

Figure 16:
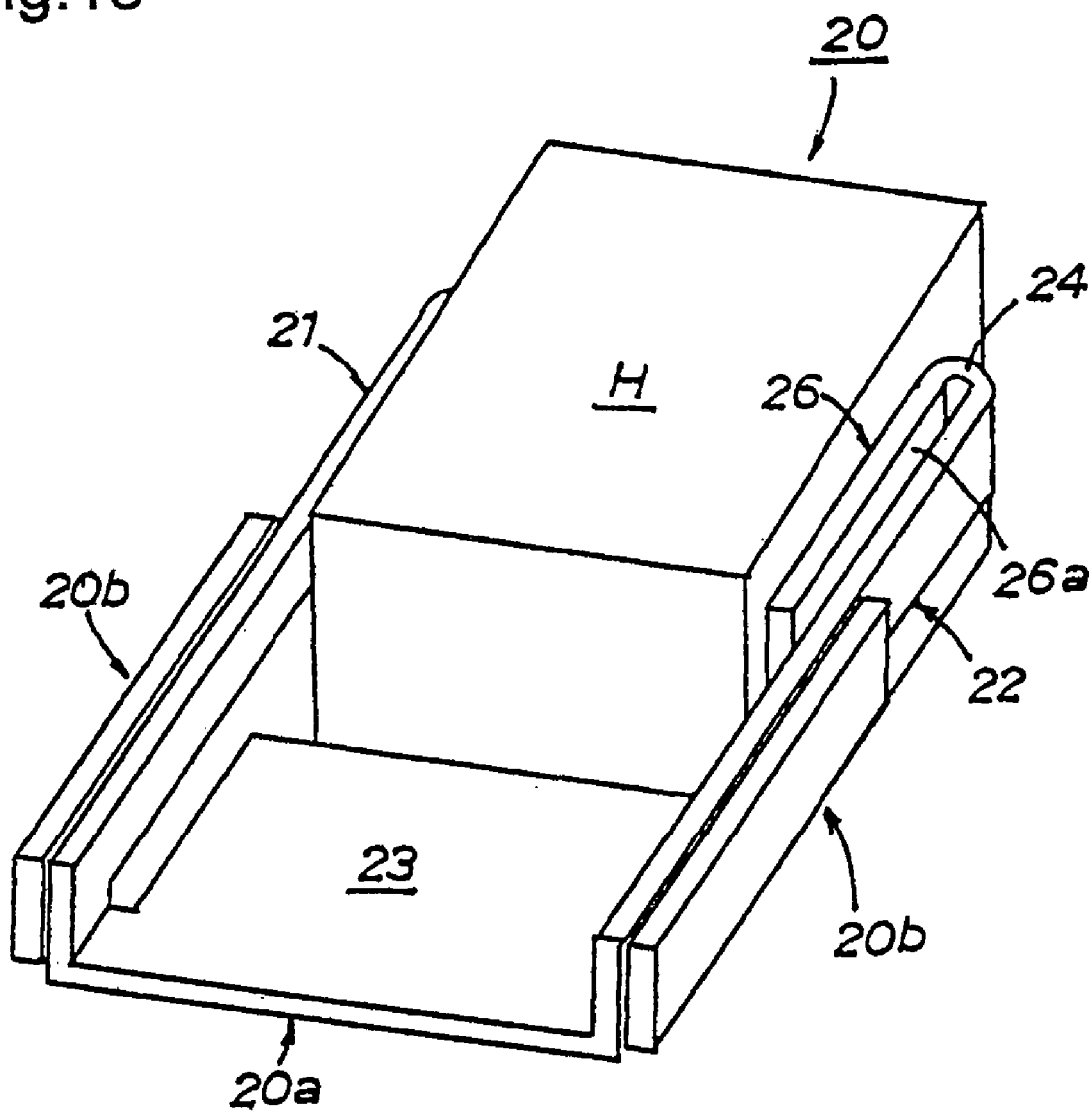
FIG. 16 is a perspective view illustrating a piezoelectric/electrostrictive device according to the second embodiment of the present invention.
Figure 17:
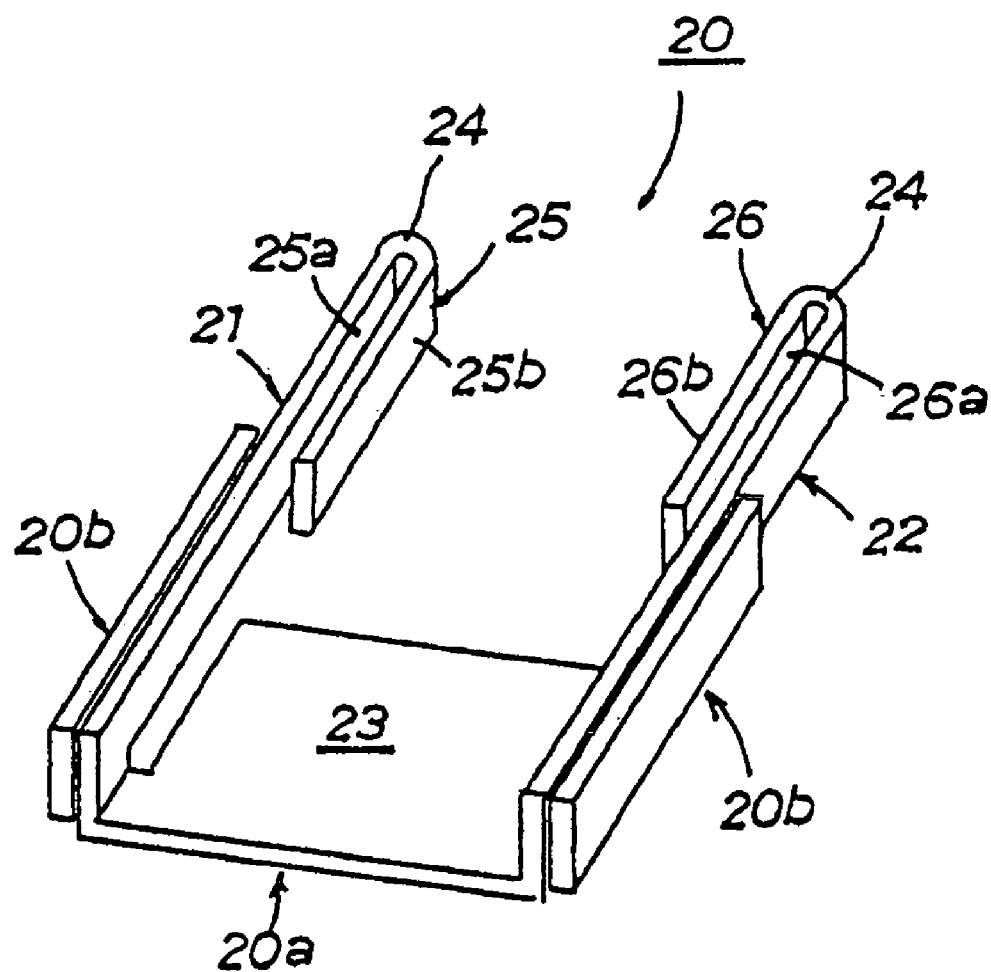
FIG. 17 is a perspective view illustrating a state in which the component is not sandwiched or held in the piezoelectric/electrostrictive device.

FIGS. 16 and 17 show a piezoelectric/electrostrictive device 20 according to the second embodiment of the present invention. Piezoelectric/electrostrictive device 20 is composed of a base 20a and a pair of piezoelectric/electrostrictive elements 20b. Base 20a is constructed by bending one sheet of flat plate made of metal. In piezoelectric/electrostrictive device 20, base 20a is constructed with a pair of right and left movable parts 21, 22, a fixing part 23 that connects movable parts 21, 22 with each other at one end thereof, and a pair of mounting parts 25, 26 that connect to the other end of movable parts 21, 22 via a connecting part 24. These sites 21 to 26 are integrally formed with one sheet of flat plate made of metal, and piezoelectric/electrostrictive element 20b is the same as piezoelectric/electrostrictive element 10b constituting the first piezoelectric/electrostrictive device 10 according to the first embodiment.

In base 20a, each of the movable parts 21, 22 constitutes an operating part by having a piezoelectric/electrostrictive element 20b adhere to an outside surface thereof. Fixing part 23 is fixed at its lower surface side, for example, by being bonded to gimbals of a suspension that holds a magnetic head of a hard disk drive.) Magnetic head H for hard disk drive for example, which is a component to be controlled, is bonded and fixed to an inside surface of each of the mounting parts 25, 26.

Each of movable parts 21, 22 constituting base 20a shows a narrow flat-plate shape erected by being bent from the side peripheries of flat-plate-shaped fixing part 23, and extends over fixing part 23 for a predetermined length towards the other end. Mounting parts 25, 26 are integral with movable parts 21, 22 via connecting part 24, and each extend for a predetermined length towards the one end along the inside surfaces of movable parts 21, 22 by being turned around at the other end of movable parts 21, 22 so as to hold slit-shaped gaps 25a, 26a of a predetermined width between mounting parts 25, 26 and inside surfaces of movable parts 21, 22.

Mounting parts 25, 26 each extend approximately to a central part of movable parts 21, 22, and the inside surfaces thereof are formed to be joining surfaces 25b, 26b for bonding magnetic head H. The side surfaces of magnetic head H are bonded to the entire surface of joining surfaces 25b, 26b via adhesives in the same manner as in piezoelectric/electrostrictive device 10. An adhesive made of epoxy resin or the like is adopted as the adhesives so as to ensure a large bonding area.

Piezoelectric/electrostrictive device 20 is substantially the same as piezoelectric/electrostrictive device 10 in that the base 20a constituting piezoelectric/electrostrictive device 20 includes mounting parts 25, 26 that extend for a predetermined length towards the one end along the inside surfaces of movable parts 21, 22 by being turned around at the other end of movable parts 21, 22, and mounting parts 25, 26 hold slit-shaped gaps 25a, 26a of a predetermined width between mounting parts 25, 26 and inside surfaces of movable parts 21, 22, and in that the inside surfaces of mounting parts 25, 26 are formed to be joining surfaces 25b, 26b for bonding component H, whereby piezoelectric/electrostrictive device 20 operates in the same manner and produces similar functions and effects as piezoelectric/electrostrictive device 10. However, base 20a constituting piezoelectric/electrostrictive device 20 according to the second embodiment of the present invention is formed by the second production method according to the present invention, as will be described below.

Figure 18:
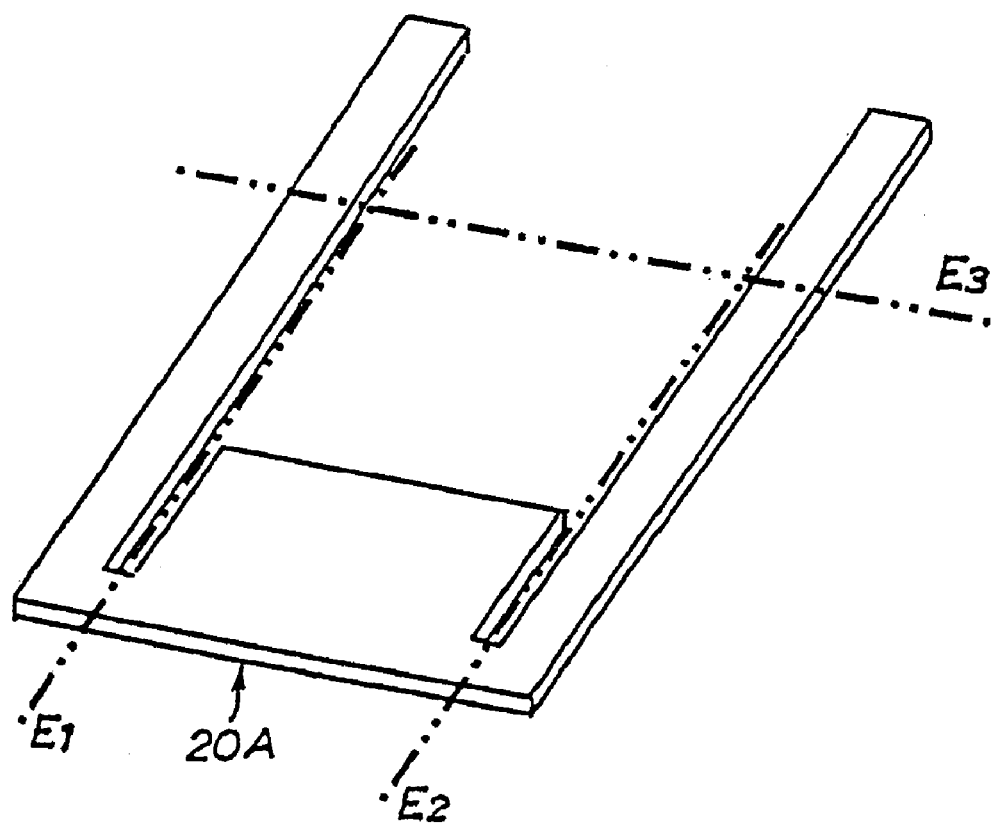
FIG. 18 is a perspective view illustrating an original base plate for forming a base that constitutes the piezoelectric/electrostrictive device.
Figure 19:
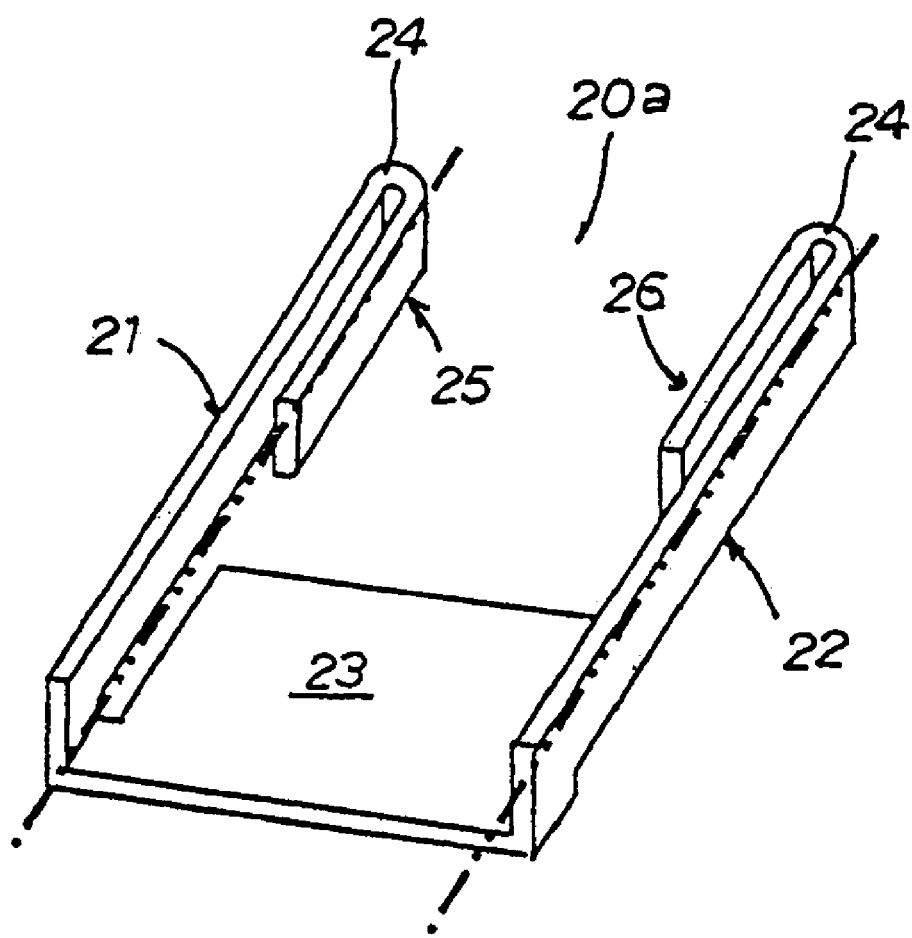
FIG. 19 is a perspective view illustrating a base formed from the base original plate.

Base 20a constituting piezoelectric/electrostrictive device 20 according to the second embodiment of the present invention is formed by using an original base plate 20A shown in FIG. 18. Original base plate 20A is formed by stamping a flat plate made of metal into a shape that delineates a planar development of base 20a, and original base plate 20A is bent along two-dotted chain lines E1, E2, E3 shown in FIG. 18. Original base plate 20A is formed into base 20a composed of movable parts 21, 22, fixing part 23, connecting part 24, and mounting parts 25, 26 by this bending process. In base 20a, slit-shaped gaps 25a, 26a are ensured between movable parts 21, 22 and mounting parts 25, 26. A piezoelectric/electrostrictive element 20b is stuck via an adhesive onto the outside surfaces of movable parts 21, 22 in base 20a thus prepared by bending, thereby to form piezoelectric/electrostrictive device 20.

Figure 20:
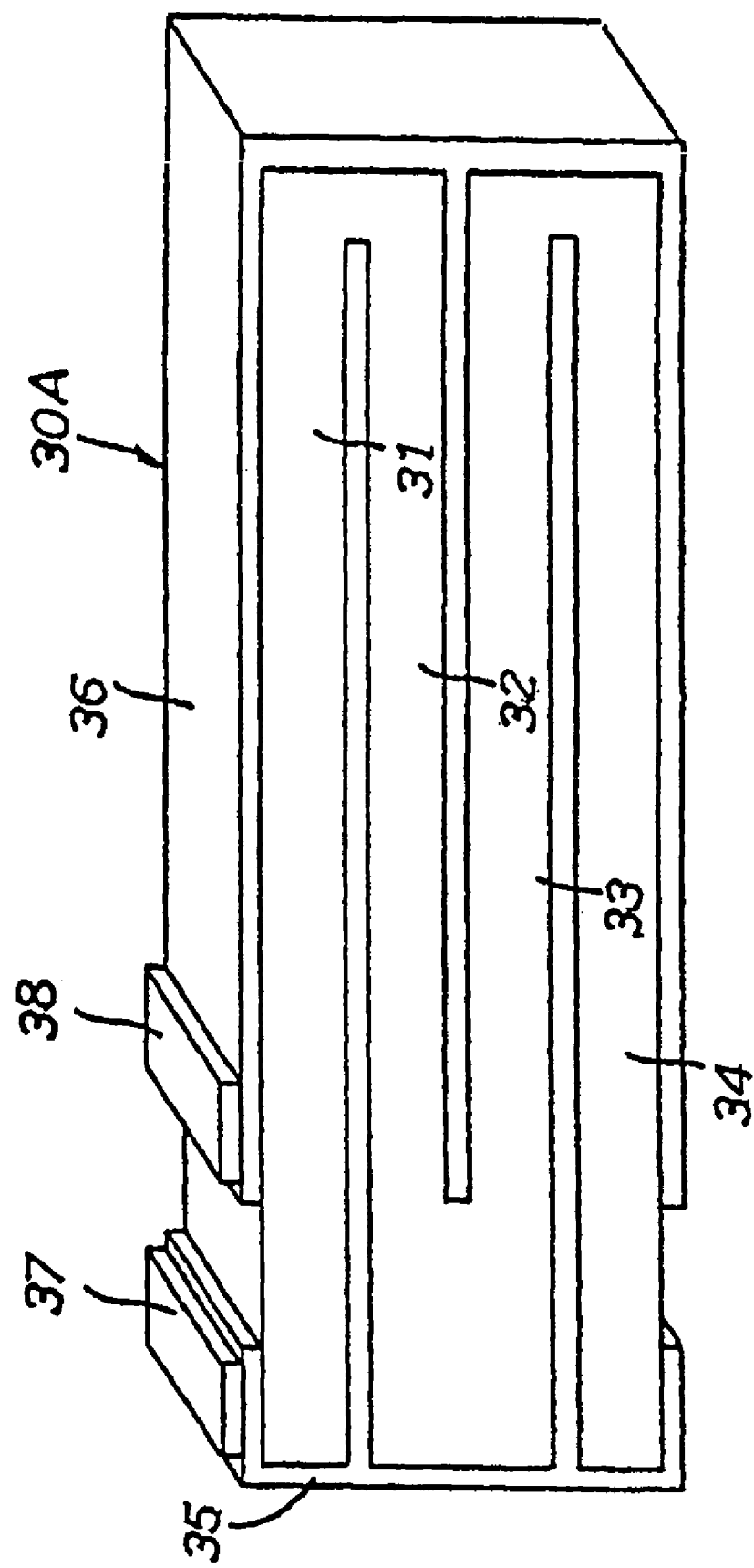
FIG. 20 is an enlarged perspective view illustrating a piezoelectric/electrostrictive element adopted in the piezoelectric/electrostrictive device of the present invention.

Conventionally known piezoelectric/electrostrictive elements can be adopted as piezoelectric/electrostrictive elements 10a, 20a constituting the first piezoelectric/electrostrictive device 10 and the second piezoelectric/electrostrictive device 20; however, piezoelectric/electrostrictive element 30A developed by the applicant of the present invention and shown in FIG. 20 is adopted in each of piezoelectric/electrostrictive devices 10, 20. In piezoelectric/electrostrictive element 30A, the piezoelectric/electrostrictive layer has a four-layer structure, and is constructed with piezoelectric/electrostrictive layers 31, 32, 33, 34, first and second electrodes 35, 36 that intervene between and surround these piezoelectric/electrostrictive layers, and a pair of terminals 37, 38. Piezoelectric/electrostrictive element 30A corresponds to the one cut out by cutting piezoelectric/electrostrictive element body 30 shown in FIG. 13.

Though piezoelectric ceramic is used in piezoelectric/electrostrictive layers 31 to 34 constituting piezoelectric/electrostrictive element 30A, one can use electrostrictive ceramic, ferroelectric ceramic, antiferroelectric ceramic, or the like as well. However, if the piezoelectric/electrostrictive device is used for positioning the magnetic head of a hard disk drive or the like purpose, it is preferable to use a material whose striction (distortion) hysteresis is small because the linearity between the displacement amount of the mounting parts and the driving voltage or the output voltage is essential. It is preferable to use a material having a coercive electric field of below 10 kV/mm.

As a material for forming piezoelectric/electrostrictive layers 31 to 34, one can specifically mention lead zirconate, lead titanate, magnesium lead niobate, zinc lead niobate, manganese lead niobate, antimony lead stannate, manganese lead tungstate, cobalt lead niobate, barium titanate, bismuth sodium titanate, potassium sodium niobate, strontium bismuth tantalate, which are used alone or as a suitable mixture thereof. Particularly, a material containing lead zirconate, lead titanate, or magnesium lead niobate as a major component, or a material containing bismuth sodium titanate as a major component is suitable.

The characteristics of the piezoelectric/electrostrictive layers can be adjusted by adding a suitable material to the materials for forming piezoelectric/electrostrictive layers 31 to 34. As a material to be added, one can mention oxides of lanthanum, calcium, strontium, molybdenum, tungsten, barium, niobium, zinc, nickel, manganese, cesium, cadmium, chromium, cobalt, antimony, iron, yttrium, tantalum, lithium, bismuth, or tin, or materials that eventually become oxides, which are used alone or as a suitable mixture thereof. For example, by allowing lanthanum or strontium to be contained in lead zirconate, lead titanate, magnesium lead niobate, or the like constituting a major component, there will be provided an advantage that the coercive electric field or the piezoelectric property can be adjusted. Here, it is preferable to avoid addition of a material that easily undergoes vitrification, such as silica. This is because a material such as silica that easily undergoes vitrification is liable to react with the piezoelectric/electrostrictive layers at the time of thermal treatment of the piezoelectric/electrostrictive layers, and changes their composition to deteriorate the piezoelectric properties.

Electrodes 35, 36 constituting piezoelectric/electrostrictive elements 30A are preferably made of a metal material that is solid at room temperature and excellent in electrical conductivity. As a metal material, one can mention metals such as aluminum, titanium, chromium, iron, cobalt, nickel, copper, zinc, niobium, molybdenum, ruthenium, palladium, rhodium, silver, tin, tantalum, tungsten, iridium, platinum, gold, or lead, which are used as a single metal or an alloy of these metals. Further, one can use a thermet material obtained by dispersing ceramics made of the same materials as or made of different materials from the piezoelectric/electrostrictive layers into these metal materials.

Piezoelectric/electrostrictive element 30A is preferably formed by integrally calcining piezoelectric/electrostrictive layers 31 to 34 and electrodes 35, 36 in a mutually laminated state. In this case, as electrodes 35, 36 it is preferable to adopt those made of a high-melting-point metal material such as platinum, palladium, or an alloy of these, or an electrode made of a thermet material which is a mixture of a high-melting-point metal material and the materials for forming piezoelectric/electrostrictive layers 31 to 34 or other ceramic materials. The thickness of electrodes 35, 36 preferably has a film shape as thin as possible because the thickness becomes a factor that affects the displacement of piezoelectric/electrostrictive element 30. For this reason, in order that the electrodes formed by being integrally calcined with piezoelectric/electrostrictive layers 31 to 34 have a film shape as thin as possible, it is preferable to use the material for forming electrodes 35, 36 in a form of a metal paste, for example, a gold resinate paste, platinum resinate paste, silver resinate paste, or the like.

The thickness of piezoelectric/electrostrictive element 30A is preferably within a range from 40 μm to 180 μm if piezoelectric/electrostrictive element 30A is to be used as piezoelectric/electrostrictive elements 10b, 20b of piezoelectric/electrostrictive devices 10, 20 according to each embodiment. If the thickness is below 40 μm, piezoelectric/electrostrictive element 30A is liable to be broken during the handling, whereas if the thickness exceeds 180 μm, the scale reduction of the device will be difficult. Further, by allowing the piezoelectric/electrostrictive element to have a multi-layer structure such as in piezoelectric/electrostrictive element 30, one can increase the output of piezoelectric/electrostrictive element to enlarge the displacement of the device. Furthermore, by allowing the piezoelectric/electrostrictive element to have a multi-layer structure, the rigidity of the device will be improved, thereby advantageously raising the resonance frequency of the device to increase the speed of the displacement operation of the device.

Piezoelectric/electrostrictive element 30A is prepared using means for cutting an original plate of a large area such as piezoelectric/electrostrictive element 30, which is formed by laminating and calcining piezoelectric/electrostrictive layers 31 to 34 and electrodes 35, 36 by printing or tape molding, cut into a predetermined dimension in a large number with the use of a dicing machine, a slicer, a wire-saw, or the like. Piezoelectric/electrostrictive element 30A is thinner and has a lower hardness than a ceramic base, so that the speed of cutting the original plate can be set to be high, whereby the original plates can be processed in a large mass and at a high speed.

Piezoelectric/electrostrictive element 30A has a simple plate-shaped structure and can be easily handled with. Also, since the surface area is small, the amount of adhering dust is small, and the stains can be easily removed. However, since piezoelectric/electrostrictive element 30A is mainly made of a ceramic material, a suitable cleaning condition must be set in supersonic cleaning. In piezoelectric/electrostrictive element cut out from the original plate, it is preferable to perform a precision cleaning treatment by US cleaning and then perform a heat treatment at 100° C. to 1000° C. in atmospheric air so as to completely remove the moisture and organic substances that have penetrated into fine pores of the ceramic material.

If piezoelectric/electrostrictive element 30A is to be adopted as piezoelectric/electrostrictive elements 10b, 20b constituting piezoelectric/electrostrictive devices 10, 20 according to each embodiment, it is preferable to use a resin-series adhesive such as epoxy resin, UV resin, or hot-melt adhesive, or an inorganic adhesive such as glass, cement, solder, or brazing material as a bonding means to the base of each piezoelectric/electrostrictive element 30A. Also, a mixture of resin-series adhesive with metal powder or ceramic powder can be used as well. The hardness of the adhesive is preferably not less than 80 in terms of Shore hardness D.

Here, it is preferable to perform a surface roughening treatment such as blasting, etching, or plating on the site of the surface of the base where piezoelectric/electrostrictive element 30A is to be bonded. By allowing the surface roughness of the bonding site to be Ra=about 0.1 μm to 5 μm, the bonding area can be enlarged to improve the adhesive strength. In this case, the surface of the bonding site on the piezoelectric/electrostrictive element side is preferably rough as well. If one wishes that the electrodes are not electrically conducted to the base, the electrodes are not disposed on the surface of the piezoelectric/electrostrictive layer constituting the lowermost layer.

If solder or brazing material is to be used as the adhesive, it is preferable to dispose an electrode layer made of a metal material on the surface of the piezoelectric/electrostrictive element in order to improve the wettability. The thickness of the adhesive is preferably within the range from 1 μm to 50 μm. The thickness of the adhesive is preferably small in view of reducing variations in the displacement and in the resonance characteristics of the device and in view of saving space; however, in order to ensure the characteristics such as adhesive strength, displacement, and resonance, the optimal thickness is set for each adhesive to be adopted.

In bonding the piezoelectric/electrostrictive element to the base, the piezoelectric/electrostrictive element is bonded to the base so that the piezoelectric/electrostrictive element completely overlaps the bending position of the fixing part while allowing the electrodes of the piezoelectric/electrostrictive element to be on the side of the fixing part of the base. The piezoelectric/electrostrictive element is preferably bonded so as to align with the end of the base on the fixing part side; however, in order to facilitate the connection between the terminals of the piezoelectric/electrostrictive element and the external terminals, one may bond the piezoelectric/electrostrictive element to protrude outward from the end of the base. However, since the piezoelectric/electrostrictive element is liable to be broken as compared with the base which is made of metal, one must take care in handling the piezoelectric/electrostrictive element. After the piezoelectric/electrostrictive element is stuck onto a predetermined position of the base with an adhesive, a cutting and cleaning process is carried out to produce the device.

The piezoelectric/electrostrictive device according to the third embodiment of the present invention is obtained by replacing ceramic with metal in the base having the same shape as base 10a constituting the first piezoelectric/electrostrictive device 10, where the base material is changed from ceramic to metal in forming the base. Further, in the production of the piezoelectric/electrostrictive device, the third production method according to the present invention is adopted.

In the third production method, metal plates are prepared instead of the ceramic green sheets in the first production method. By laminating and bonding metal plates, the base is prepared. As bonding means, one can adopt bonding, brazing, soldering, diffusion-joining, supersonic joining, thermal press-bonding, cladding method or the like using an adhesive such as organic resin or glass. Further, one can adopt means for integrating the laminated metal plates by welding or the like.

For preparation of the window part of each metal plate to be laminated, one can adopt laser processing, electric discharge machining, etching, sand-blasting, or the like in addition to stamping with a mold. As the material of the metal plates constituting the base, one can adopt the same material as the material of base 20a of piezoelectric/electrostrictive device 20.

Here, in the production method, as the material constituting the base, one can use metal plates and ceramic plates in combination, and this can form a base having a hybrid structure. For further extended modification, one can adopt resin as the material constituting the base to form a base made of resin and, depending on the usage of the piezoelectric/electrostrictive device, one can construct a piezoelectric/electrostrictive device having a base made of resin as a constituent member.

In the production method, the number of times for bonding and the order of bonding for laminating and integrating the metal plates are by no means limited, and the number of sheets, the shape, the thickness, and others of the metal plates are suitably determined in accordance with the set structure. One can allow a metal member (thick plate) made by casting to partially intervene. Here, in the production method, one can adopt a carbon material or a resin material in place of metal plates if the bonding method or the material does not raise a problem.

For the piezoelectric/electrostrictive element to be used, one can adopt a piezoelectric/electrostrictive element 30A1 in the same manner as piezoelectric/electrostrictive elements 10b, 20b of piezoelectric/electrostrictive devices 10, 20. For example, after the piezoelectric/electrostrictive element body 30 is stuck onto a predetermined position of the base with an adhesive, a cutting and cleaning process can be carried out to produce the piezoelectric/electrostrictive device. The piezoelectric/electrostrictive element is preferably constructed with at least four layers. Further, the piezoelectric/electrostrictive element is preferably constructed with at most 10 layers. The piezoelectric/electrostrictive element is preferably prepared by the printing multilayer method. The positional shift of the electrodes of the piezoelectric/electrostrictive element is preferably below 50 μm. If the number of layers of the piezoelectric/electrostrictive layers is increased, the driving power can be enhanced; however, in accordance therewith, the power consumption increases. Therefore, in practically carrying out the process, one may determine the number of layers suitably in accordance with the usage. It is preferable to produce the piezoelectric/electrostrictive element by a method of forming a film such as a thin film or a thick film. One may also prepare a piezoelectric/electrostrictive element on a supporting substrate by the sputtering method, the CVD method, the sol-gel method, or the like, and bond the piezoelectric/electrostrictive element together with the supporting substrate. Alternatively, one may peel the piezoelectric/electrostrictive element off from the supporting substrate before bonding.

In constructing the base with a metal material, it is preferable to adopt a cold-calendered metal plate at least in the movable parts.

EXAMPLES

Example 1

Figure 21:
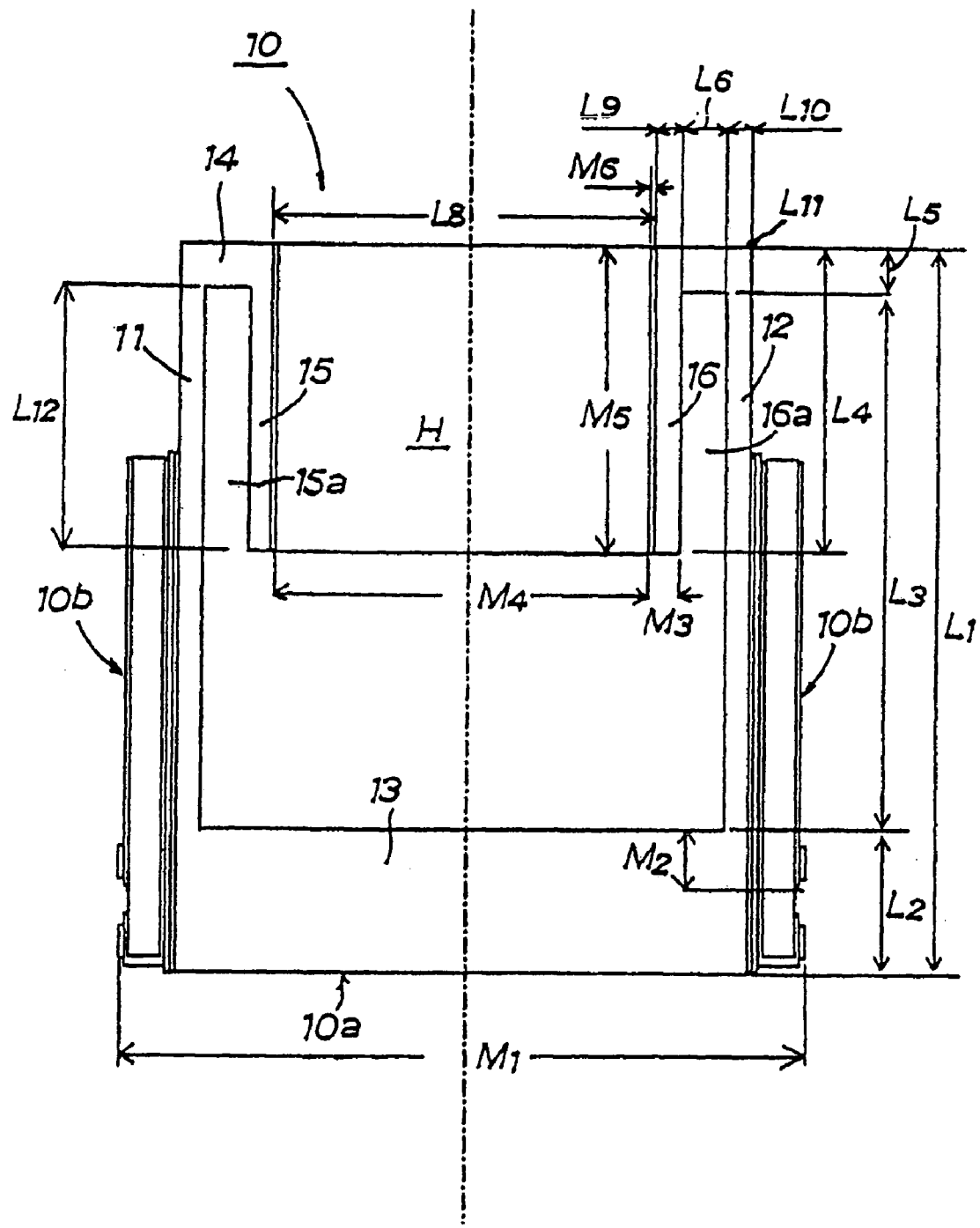
FIG. 21 is a plan view illustrating a dimensional relationship of the piezoelectric/electrostrictive device prepared in embodiment 1 of the present invention.

In this Example, a piezoelectric/electrostrictive device 10 according to the first embodiment of the present invention is prepared, and FIG. 21 shows the dimensional relationship of piezoelectric/electrostrictive device 10 and each site of component H. Symbols L of the same series in piezoelectric/electrostrictive device 10 each denote the length L1 of the device (total length of the base), the length L2 of the fixing part in the base, the length L3 of the arm of the movable parts in the base, the length L4 of the joining surface of the mounting parts in the base, the length L5 of the connecting part, the interval L6 of the slit-shaped gaps between the movable parts and the mounting parts, the interval L7 between the two movable parts, the interval L8 between the two mounting parts, the thickness L9 of the mounting parts, the thickness L10 of the movable parts, the height L11 of the movable parts (the distance in the front-and-back direction of the document sheet), and the length L12 of the slit-shaped gaps.

Further, other symbols M of the same series each denote the total width M1 of the device, the length M2 by which the end of the substantial driving part of the piezoelectric/electrostrictive element overlaps with the fixing part, the thickness M3 between the mounting parts and the piezoelectric/electrostrictive element, the lateral length M4 of component H, the longitudinal length M5 of component H, and the thickness M6 of the adhesive.

In piezoelectric/electrostrictive device 10, the relationship between the interval L8 of the mounting parts and the lateral length M4 of the piezoelectric/electrostrictive device is such that L8≧M4, more preferably L8=M4. If L8<M4, it is necessary to enlarge the gap between the two mounting parts in inserting component H, and there is a fear of breaking the device in enlarging the gap between the two mounting parts. The thickness M6 of the adhesive is from 0.1 to 0.005 mm, preferably from 0.05 to 0.01 mm. If the thickness of the adhesive is larger than 0.1 mm, there will be a large influence of the temperature on the displacement of the two movable parts at a high temperature. Further, since the difference of the interval L8 between the two mounting parts from the lateral length M4 of the piezoelectric/electrostrictive device is small, it is difficult to insert component H between the two mounting parts or to inject an adhesive between the mounting parts, making it difficult to control the thickness of the adhesive. For this reason, if the thickness M6 of the adhesive is set to be smaller than 0.01 mm, variations are liable to occur in the adhesive strength to component H. Therefore, the thickness M6 of the adhesive is more preferably from 0.01 to 0.03 mm.

In the piezoelectric/electrostrictive device 10, the relationship between the length L5 of the connecting part and the thickness L10 of the movable parts is such that L5≧L10, and the relationship between the length L5 of the connecting part and the thickness L9 of the mounting parts is such that L5≧L9. The connecting part is a site that connects the movable parts to the mounting parts, and is structurally the weakest site. Therefore, if the length L5 of the connecting part does not satisfy these relationships, the connecting part becomes liable to be broken. The relationship between the longitudinal length M5 of component H and the length L4 of the joining surfaces of the mounting parts is such that M5≧L4. The joining surfaces of the mounting parts function so as to ensure the adhesive strength to component H, and it makes no sense if the length L4 of the joining surfaces of the mounting parts is made longer than the longitudinal length M5 of component H. However, if the component to be adopted has a different shape from that of component H, for example, if it is a component having a shape shown in FIGS. 8 and 9, this does not apply.

In piezoelectric/electrostrictive device 10, the interval L6 of the slit-shaped gaps (slit gaps) between the movable parts and the mounting parts is from 0.2 to 0.001 mm, preferably from 0.1 to 0.01 mm, more preferably from 0.07 to 0.03 mm. If the interval L6 of the slit gaps is below 0.001 mm, the movable parts are brought into contact with the mounting parts at the time of high displacement of the movable parts, thereby to restrict the displacement operation of the movable parts. Further, if the interval L6 of the slit gaps is larger than 0.2 mm, the total lateral width M1 of the device will be larger, which is meaningless. If component H is to be joined with the mounting parts, the injected adhesive is liable to go around into the slit gaps to fill the slit gaps. If the interval L6 of the slit gaps is larger than 0.03 mm, the going around of the adhesive into the slit gaps is restrained.

In this case, it is essential to control the amount of adhesive so that the adhesive may not come out of the joining surfaces of the mounting parts, and also the interval L6 of the slit gaps is preferably larger than the thickness M6 of the adhesive. Here, piezoelectric/electrostrictive device 10 can have a mode of having a stopper function against the impact from the outside of the movable parts by utilizing the abutment of the movable parts to the mounting parts at the time of high displacement operation of the two movable parts.

The length L12 of the slit-shaped gaps is set to be at least two times, preferably at least five times, as large as the length L5 of the connecting part. This allows that, even if the length M5 of component H cannot be made equal to the length L4 of the mounting parts, that is, even if M5>L4, the bonding area to component H can be set to be large to ensure an adhesive strength, and also the length L3 of the arm of the movable parts can be set to be large to ensure a large displacement.

In piezoelectric/electrostrictive device 10, the thickness L9 of the mounting parts is from 0.2 to 0.11 mm, preferably from 0.1 to 0.02 mm, more preferably from 0.07 to 0.03 mm. If the thickness L9 of the mounting parts exceeds 0.2 mm, the total width M1 of the device will be disadvantageously large, whereas if the thickness L9 of the mounting parts is below 0.01 mm, the device is liable to be broken. The thickness L10 of the movable parts is from 0.2 to 0.001 mm, preferably from 0.1 to 0.01 mm, more preferably from 0.08 to 0.03 mm. In view of saving space of the device, the length L2 of the fixing part, the arm length L3 of the movable parts, the length L5 of the connecting part, the interval L6 of the slit gaps, the thickness L9 of the mounting parts, the thickness L10 of the movable parts, and the thickness M6 of the adhesive are preferably as small as possible. This reduces the total length L1 and the total width M1 of the device.

In piezoelectric/electrostrictive device 10, the arm length L3 of the movable parts is from 0.2 to 3 mm, preferably from 0.3 to 2 mm. The length L4 of the joining surfaces of the mounting parts is from 0.05 to 2 mm. The interval L7 between the two movable parts is from 0.1 to 2 mm, preferably from 0.2 to 1.6 mm. The thickness L9 of the mounting parts is from 0.002 to 0.1 mm, preferably from 0.01 to 0.08 mm. The height L11 of the movable parts is from 0.05 to 2 mm, preferably from 0.1 to 0.5 mm. The thickness M3 between the mounting parts and the piezoelectric/electrostrictive element is from 0.0007 to 0.5 mm. In these dimensions, the ratio of the arm length L3 of the movable parts to the interval L7 between the two movable parts is from 0.5 to 10, preferably from 0.5 to 5. The ratio of the interval L7 between the two movable parts to the thickness L10 of the movable parts is from 0.5 to 20, preferably from 1 to 15, more preferably from 1 to 10. The thickness L10 of the movable parts and the height L11 of the movable parts satisfy a relationship of L10<L11. The thickness L10 of the movable parts and the length M2 by which the end of the substantial driving part of the piezoelectric/electrostrictive element overlaps with the fixing part satisfy a relationship of M2>(L10)/2.

Example 2

Figure 22:
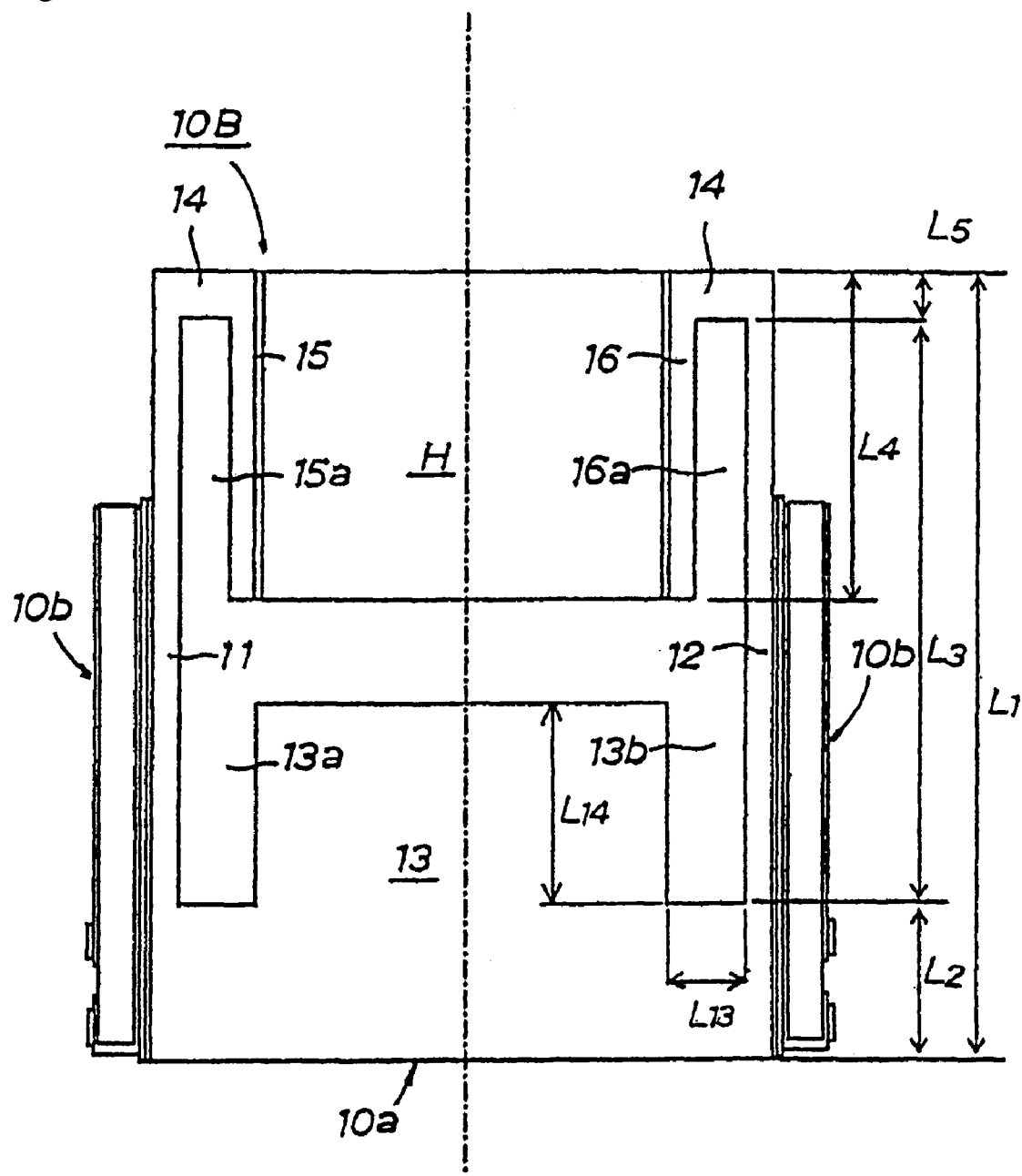
FIG. 22 is a plan view illustrating a dimensional relationship of the piezoelectric/electrostrictive device prepared in embodiment 2 of the present invention.

This Example is a modified example in which the first piezoelectric/electrostrictive device 10 according to the present invention is modified, where a piezoelectric/electrostrictive device 10B is prepared in which the base has a form corresponding to the base of the piezoelectric/electrostrictive device shown in FIG. 15. The dimensional relationship of the sites of piezoelectric/electrostrictive device 10B is shown in FIG. 22. Symbols L of the same series in piezoelectric/electrostrictive device 10B are the same as those in piezoelectric/electrostrictive device 10 formed in Example 1; however, the dimensions of some of the sites and the dimension of the sites of component H are omitted.

However, in piezoelectric/electrostrictive device 10B, the width L13 of the slit-shaped gaps in the fixing part and the length L14 of the slit-shaped gaps on the fixing part side, which are not present in piezoelectric/electrostrictive device 10, have been added.

In piezoelectric/electrostrictive device 10B, the width L13 of the slit-shaped gaps of the fixing part is from 0.2 to 0.001 mm, preferably from 0.1 to 0.01 mm, more preferably from 0.07 to 0.03 mm. Further, the length L14 of the slit-shaped gaps of the fixing part can be a length till the fixing part interferes with component H, and is preferably from 0.05 to 2 mm, more preferably from 0.1 to 0.5 mm. Here, the dimensions of the other sites are set to be the same dimensions as in piezoelectric/electrostrictive device 10 prepared in Example 1.

What is claimed:

1. A method of producing a piezoelectric/electrostrictive device having a base including a pair of movable parts opposing each other, a fixing part that connects the movable parts with each other at one end thereof, and mounting parts that extend for a predetermined length while holding slit-shaped gaps of a predetermined width along inside surfaces of said movable parts by being turned around at the other end of said movable parts, said piezoelectric/electrostrictive device having a piezoelectric/electrostrictive element disposed on at least one outside surface of said movable parts of said base, wherein a flexible and bendable flat plate made of metal is adopted as a material for forming said base, and the base including said movable parts, said fixing part, and said mounting parts is formed by stamping said flat plate into a shape that delineates a planar development of said base so as to obtain a stamped structure, and bending said stamped structure at a predetermined site.

* * * * *